(12) United States Patent
Edahiro

(10) Patent No.: US 8,400,837 B2
(45) Date of Patent: Mar. 19, 2013

(54) SEMICONDUCTOR MEMORY DEVICE WITH MEMORY CELLS HAVING CHARGE ACCUMULATION LAYER

(75) Inventor: Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 227 days.

(21) Appl. No.: 12/797,965

(22) Filed: Jun. 10, 2010

(65) Prior Publication Data

US 2010/0322011 A1   Dec. 23, 2010

(30) Foreign Application Priority Data

Jun. 22, 2009 (JP) ................................ 2009-147856

(51) Int. Cl.
*G11C 16/06* (2006.01)
(52) U.S. Cl. ................ 365/185.23; 365/182; 365/185.18
(58) Field of Classification Search ............. 365/185.03, 365/185.18, 185.23, 185.24
See application file for complete search history.

(56) References Cited

U.S. PATENT DOCUMENTS

| | | | |
|---|---|---|---|
| 6,850,435 B2 | 2/2005 | Tanaka | |
| 6,885,583 B2 | 4/2005 | Tanaka | |
| 7,542,321 B2 | 6/2009 | Maejima et al. | |
| 2008/0232183 A1* | 9/2008 | Maejima et al. | 365/205 |

FOREIGN PATENT DOCUMENTS

| | | |
|---|---|---|
| JP | 2009-33099 | 2/2009 |
| JP | 2009-59460 | 3/2009 |
| KR | 10-0674546 | 1/2007 |
| KR | 10-2009-0000366 | 1/2009 |

OTHER PUBLICATIONS

Korean Office Action issued Jun. 15, 2011, in Patent Application No. 10-2010-0058705 (with English-language translation).

* cited by examiner

*Primary Examiner* — Pho M Luu
*Assistant Examiner* — Thao Bui
(74) *Attorney, Agent, or Firm* — Oblon, Spivak, McClelland, Maier & Neustadt, L.L.P.

(57) ABSTRACT

According to one embodiment, a semiconductor memory device includes memory cells, a memory cell array, a word line, a bit line, a source line, a row decoder, a sense amplifier, and a first MOS transistor. The word line is connected to gates of the memory cells. The bit line is electrically connected to drains of the memory cells. The source line is electrically connected to sources of the memory cells. The row decoder selects the word line. The sense amplifier senses and amplifies data read onto the bit line in a read operation. The first MOS transistor is capable of connecting a well region where the memory cells are formed with the source line and is arranged between the row decoder or the sense amplifier and the memory cell array.

5 Claims, 20 Drawing Sheets

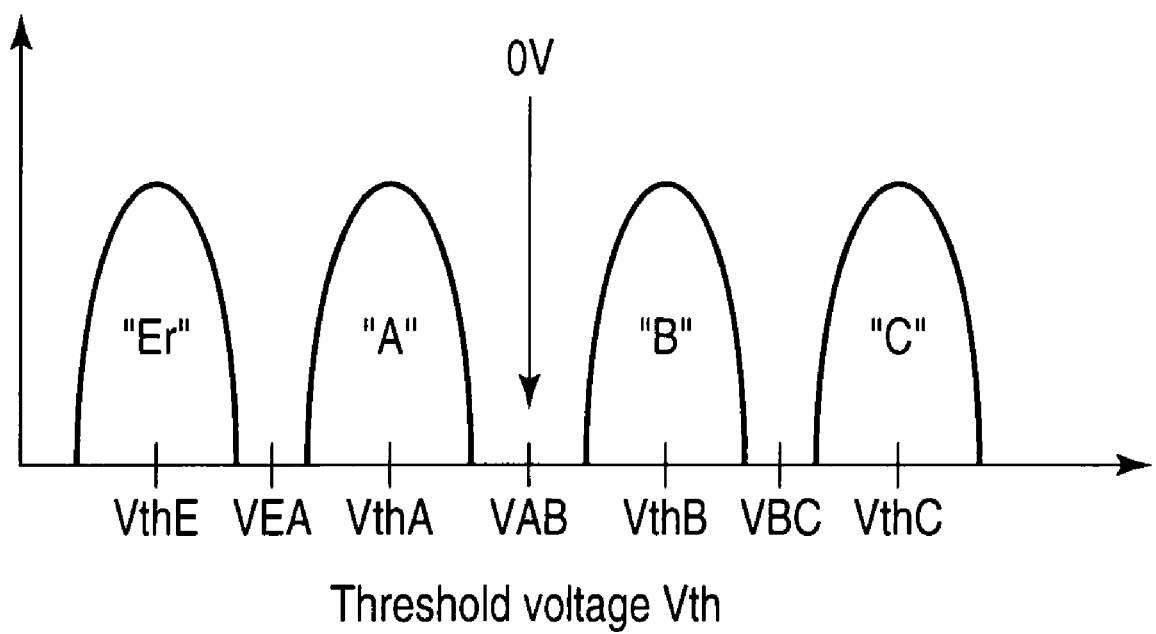
F I G. 2

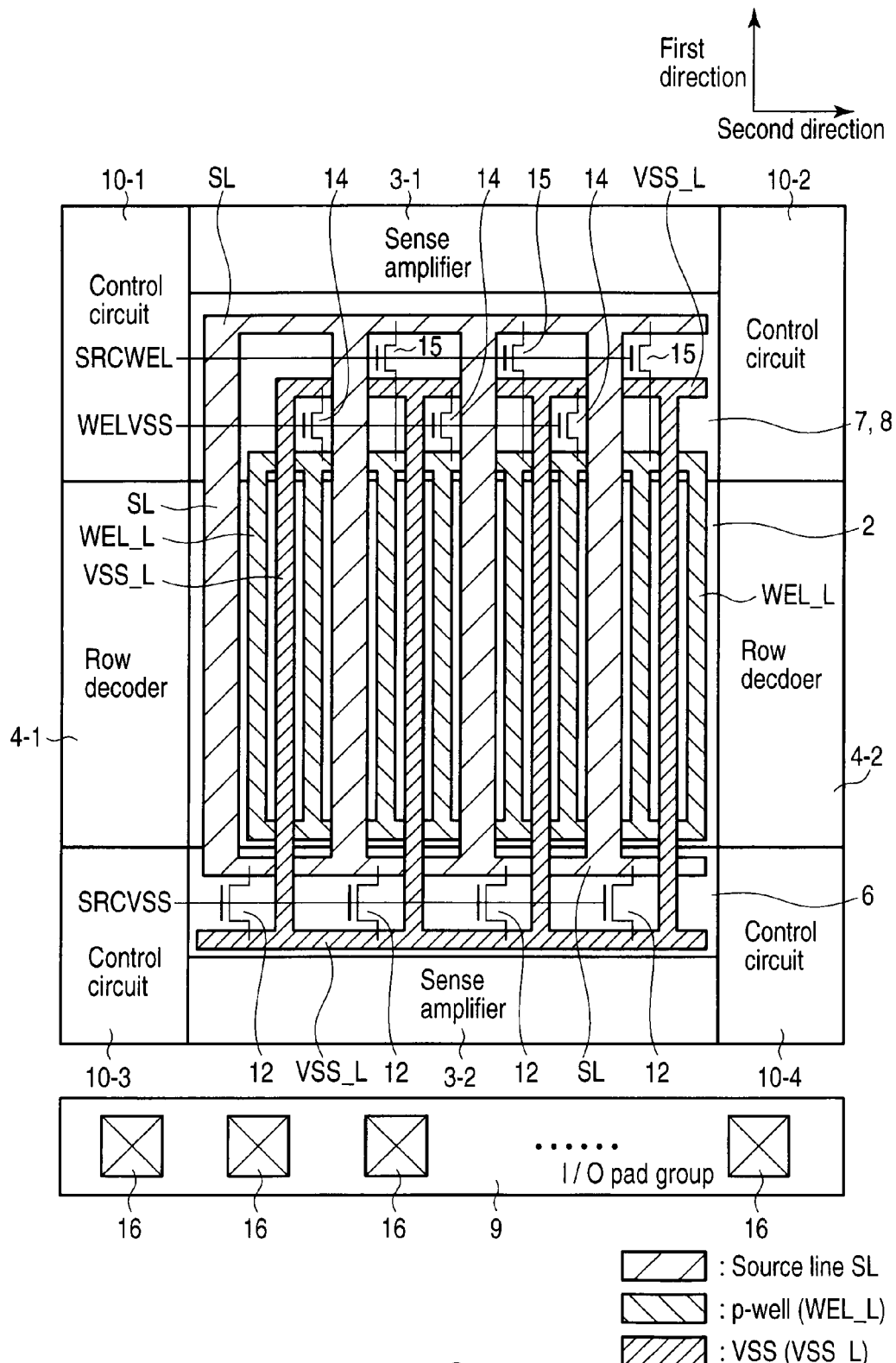
F I G. 3

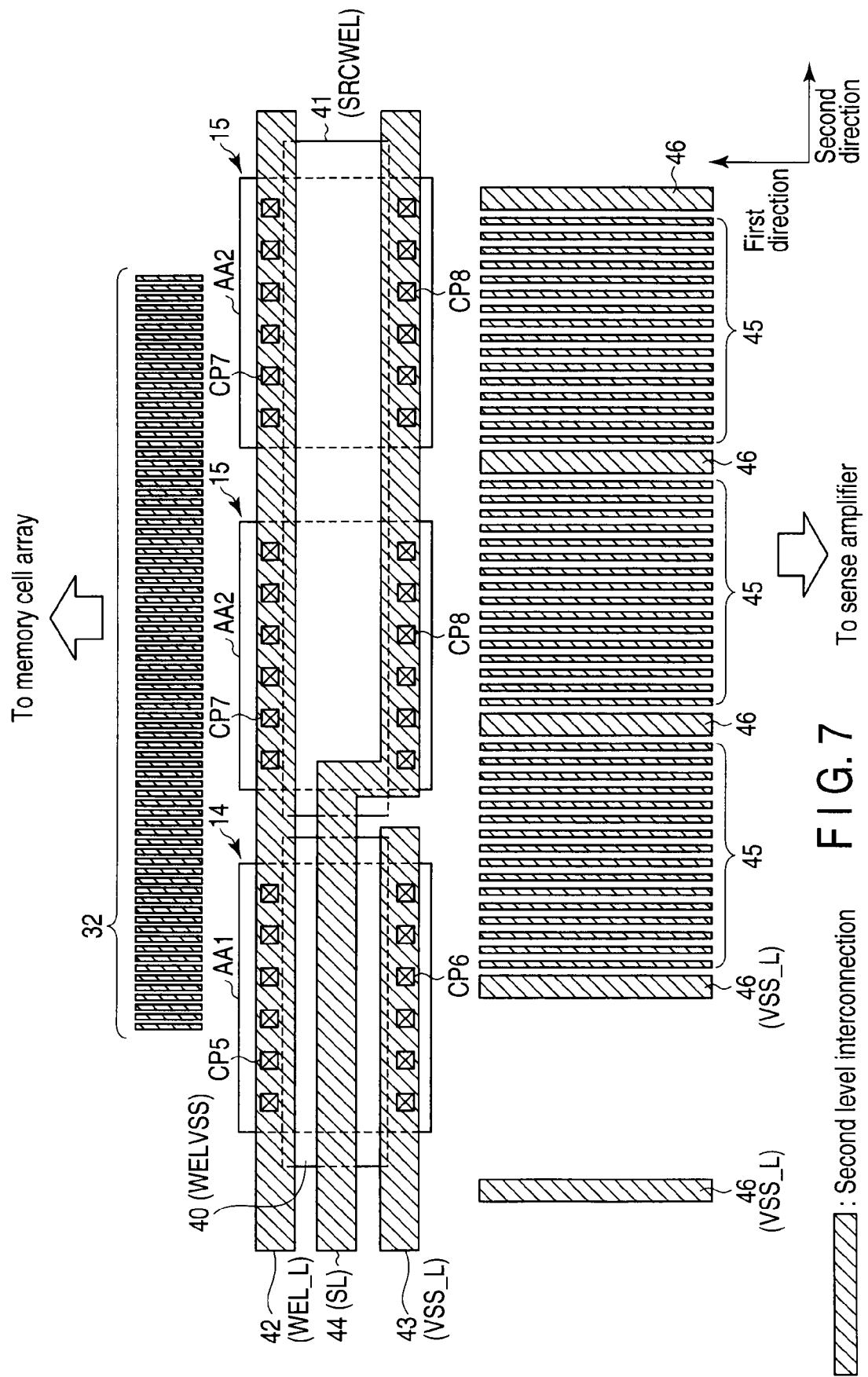
F I G. 7

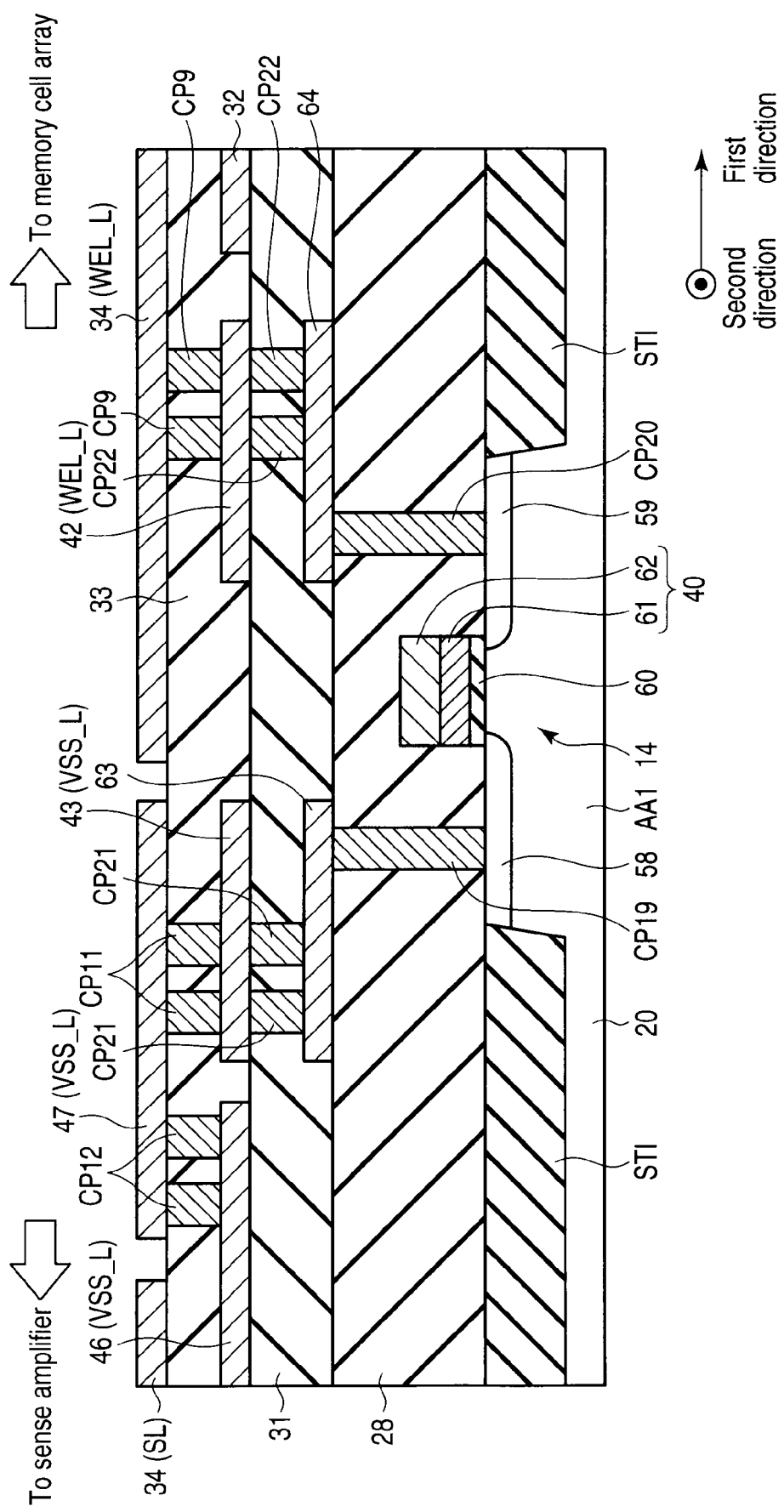
F I G. 10

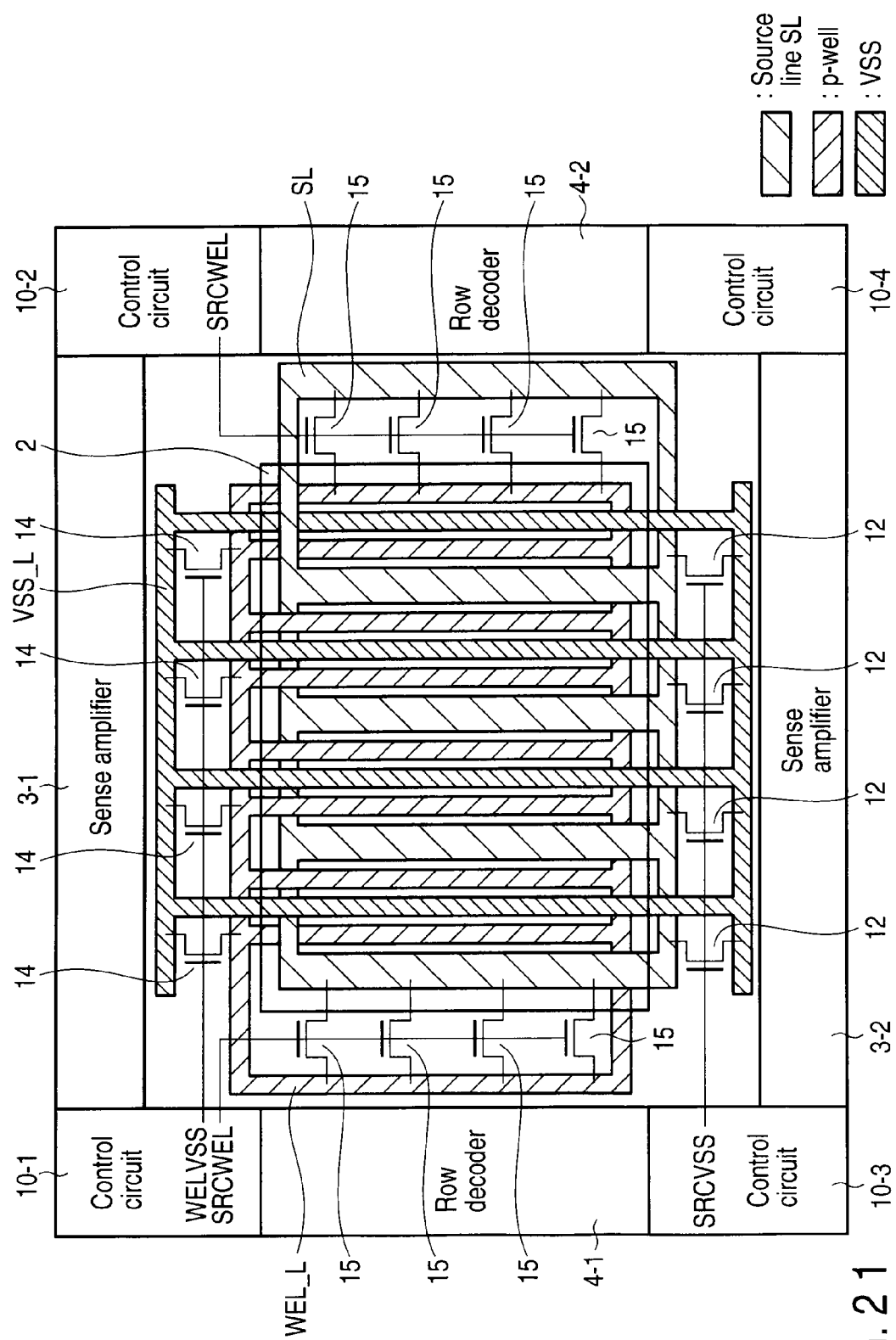
F I G. 21

SEMICONDUCTOR MEMORY DEVICE WITH MEMORY CELLS HAVING CHARGE ACCUMULATION LAYER

CROSS-REFERENCE TO RELATED APPLICATIONS

This application is based upon and claims the benefit of priority from Japanese Patent Application No. 2009-147856, filed Jun. 22, 2009; the entire contents of which are incorporated herein by reference.

FIELD

Embodiments described herein relate generally to a semiconductor memory device with memory cells having a charge accumulation layer.

BACKGROUND

One known nonvolatile semiconductor memory is a NAND flash memory. In a NAND flash memory, when data is read or verified, specific potentials are applied to the source of a memory cell and a well region in which the memory cell has been formed. Various methods of arranging metal interconnection layers for applying the potentials have been proposed. One of the propositions has been disclosed in, for example, Jpn. Pat. Appln. KOKAI Publication No. 2009-033099. It is desirable that the interconnections should be arranged so that the interconnection resistance (parasitic resistance) may be minimized. In this respect, when the length of the metal interconnection layer becomes longer, the effect of the interconnection resistance can increase to the degree that it is not negligible, which might lead to erroneous reading or writing.

In addition, when data is read, it is necessary to apply a specific potential to the source line through a MOS transistor. In this case, if the gate-source voltage of the MOS transistor is close to its threshold value, the operation of the MOS transistor becomes unstable, which might result in a decrease in the reading accuracy.

BRIEF DESCRIPTION OF THE DRAWINGS

FIG. 2 is a graph showing the distribution of threshold values of a memory cell according to the first embodiment;

FIG. 3 is a block diagram of a flash memory according to the first embodiment;

FIGS. 6 to 8 are plan views of a well driver and a short circuit according to the first embodiment;

FIGS. 9, 10, and 11 are sectional views taken along line 9-9, line 10-10, and line 11-11 of FIG. 6, respectively;

FIGS. 21 and 22 are block diagrams according to modifications of the first and second embodiments, respectively.

DETAILED DESCRIPTION

In general, according to one embodiment, a semiconductor memory device includes: memory cells; a memory cell array; a word line; a bit line; a source line; a row decoder; a sense amplifier; and a first MOS transistor. The memory cells are capable of holding data. The memory cells are arranged in the memory cell array. The word line is connected to gates of the memory cells. The bit line is electrically connected to drains of the memory cells. The source line is electrically connected to sources of the memory cells. The row decoder selects the word line. The sense amplifier senses and amplifies data read onto the bit line in a read operation. The first MOS transistor is capable of connecting a well region where the memory cells are formed with the source line and is arranged between the row decoder or the sense amplifier and the memory cell array.

[First Embodiment]

A semiconductor memory device according to a first embodiment will be explained, taking a NAND flash memory as an example.

<Configuration of NAND Flash Memory>

Figure 1:
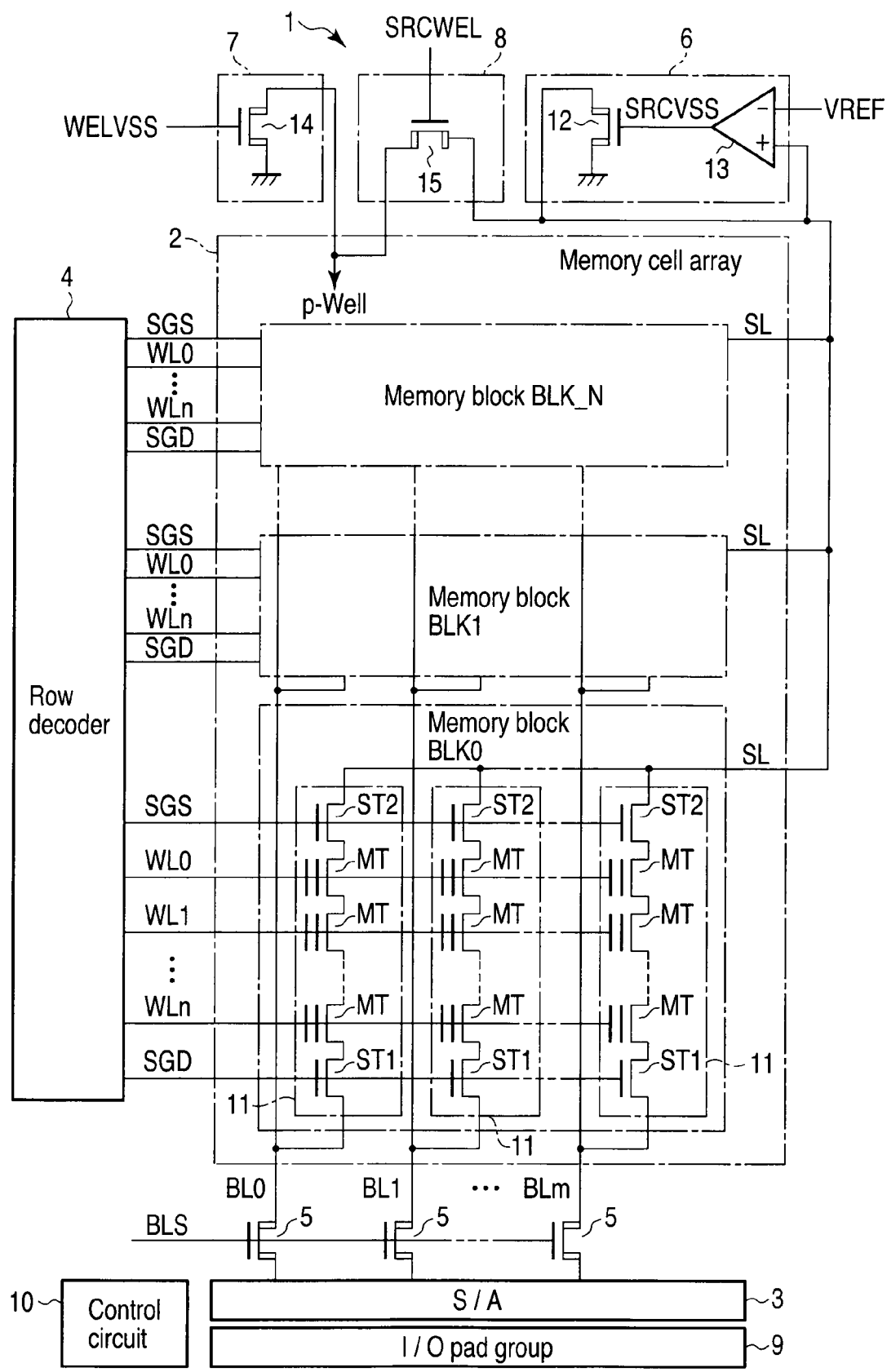
FIG. 1 is a block diagram of a flash memory according to a first embodiment.

FIG. 1 is a block diagram of a NAND flash memory according to the first embodiment. As shown in FIG. 1, the NAND flash memory 1 includes a memory cell array 2, a sense amplifier 3, a row decoder 4, MOS transistors 5, a source line driver 6, a well driver 7, a short circuit 8, an input/output pad group 9, and a control circuit 10.

First, the memory cell array 2 will be explained. The memory cell array 2 includes a plurality (an (N+1) number) of memory cell blocks BLK0 to BLKN (N is a natural number not less than 1). Hereinafter, when there is no need to distinguish between memory blocks BLK0 to BLKN, they will simply be referred to as memory blocks BLK. Only one memory block BLK may be provided. Each of the memory blocks BLK includes an (m+1) number of NAND strings 11 ((m+1) is a natural number not less than 1).

Each of the NAND strings 11 includes an (n+1) number of memory cell transistors MT ((n+1) is a natural number not less than 2, for example, 8, 16, 32, or 64, and is nonlimiting) and select transistors ST1, ST2. Each of the memory cell transistors MT has a stacked gate structure including a charge accumulation layer (e.g., a floating gate) formed on a semiconductor substrate with a gate insulating film interposed therebetween, and a control gate formed on the charge accumulation layer with an inter-gate insulating film interposed therebetween. Adjacent memory cell transistors MT share a source or a drain. The memory cell transistors MT are arranged between select transistors ST1, ST2 in such a manner that their current paths are connected in series. The drain on one end side of the memory cell transistors MT connected in series is connected to the source of select transistor ST1 and the source on the other end side is connected to the drain of select transistor ST2.

In each of the memory blocks BLK, the control gates of memory cell transistors MT in the same row are connected to any one of word lines WL0 to WLn in a common connection manner. The gates of select transistors ST1 of the memory cells in the same row are connected to a select gate line SGD in a common connection manner. The gates of select transistors ST2 of the memory cells in the same row are connected to a select gate line SGS in a common connection manner. To simplify the explanation, word lines WL0 to WLn will sometimes simply be referred to as word lines WL. The sources of select transistors ST2 are connected to a source line SL in a common connection manner.

In the memory cell array 2 configured as described above, the drains of select transistors ST1 of NAND strings 11 in the same column are connected to one of bit lines BL0 to BLm in a common connection manner. Bit lines BL0 to BLm will sometimes simply be referred to as bit lines BL. That is, bit lines BL are connected to NAND strings 11 in a common connection manner between a plurality of memory blocks BLKs. Word lines WL and select gate lines SGD, SGS are connected to NAND strings 11 in a common connection manner in the same memory block BLK. The NAND strings 11 included in the memory cell array 2 are connected to the same source line SL in a common connection manner.

Data is written or read en bloc into or from a plurality of memory cell transistors MT connected to the same word line WL. This unit is called a page. Data is erased en bloc from the NAND strings 11 in the same memory block BLK. That is, a memory block BLK is an erasing unit.

FIG. 2 shows the distribution of threshold values of the memory cell transistor MT. In FIG. 2, the abscissa axis shows a threshold voltage Vth and the ordinate shows the existing probability of memory cell transistor MT.

As shown in FIG. 2, each of the memory cell transistors MT can hold 4-level data (2-bit data). That is, the memory cell transistor MT can take four states (4 items of data): erase level ("Er"), level A, level B, and level C in ascending order of threshold voltage Vth. Threshold voltage VthE at the erase level satisfies the expression VthE<VEA. Threshold voltage VthA at level A satisfies the expression VEA<VthA<VAB. Threshold voltage VthB at level B satisfies the expression VAB<VthB<VBC. Threshold voltage VthC at level C satisfies the expression VBC<VthC. For example, voltage VAB is at 0 V. Alternatively, VBC may be at 0 V. Data the memory cell transistor MT can hold is not limited to the above four values. For example, the data may be 2-level data (1-bit data), 8-level data (3-bit data), or 16-level data (4-bit data).

To return to FIG. 1, the configuration of flash memory 1 will explained further. Sense amplifier 3, in a read operation, senses data read from a memory cell transistor MT onto a bit line BL and amplifies the data. At this time, sense amplifier 3 senses a current flowing through bit lines BL, thereby determining data on all the bit lines BL simultaneously. Alternatively, voltage may be sensed. In a write operation, sense amplifier 3 transfers write data to a bit line BL.

When writing, reading, or erasing data, row decoder 4, on the basis of row address RA externally supplied, selects the select gate lines SGD, SGS and word line WL connected to any one of the memory blocks BLK and applies voltages to them.

The source line driver 6 applies a voltage to source line SL. The source line driver 6 includes an n-channel MOS transistor 12 and an operational amplifier 13. Operational amplifier 13 compares the potential of source line SL with a reference voltage VREF supplied from, for example, control circuit 10 and outputs the comparison result as signal SRCVSS. MOS transistor 12 has its source grounded and its drain connected to source line SL. Signal SRCVSS is supplied to the gate of MOS transistor 12. MOS transistor 12 is a high-withstand-voltage transistor whose gate insulating film is thicker than that of, for example, memory cell transistor MT.

With this configuration, when the potential of source line SL has exceeded VREF, MOS transistor 12 is turned on. This keeps the potential of source line SL almost at VREF. The value of VREF, which can be set variously by, for example, control circuit 10, is at 0 V or a positive potential.

Well driver 7 applies a voltage to a well region in which memory cell transistors MT are formed. Well driver 7 includes an n-channel MOS transistor 14. MOS transistor 14 has its source grounded and its drain connected to the well region. Signal WELVSS is input to the gate of MOS transistor 14. Signal WELVSS is supplied by, for example, control circuit 10. Like MOS transistor 12, MOS transistor 14 is a high-withstand-voltage transistor. MOS transistor 14 is turned on, thereby applying 0 V to the well region. For example, the number of MOS transistors 14 is made smaller than that of MOS transistors 15.

Short circuit 8 short-circuits source line SL with the well region. Short circuit 8 includes an n-channel MOS transistor 15. One end of the current path of MOS transistor 15 is connected to source line SL. The other end of the current path is connected to the well region. Signal SRCWEL is input to the gate of MOS transistor 15. Signal SRCWEL is supplied by, for example, control circuit 10. MOS transistor 15 is also a high-withstand-voltage transistor. MOS transistor 15 is turned on, thereby short-circuiting source line SL with the well region.

Each of MOS transistors 5 connects sense amplifier 3 to a bit line BL. That is, one end of the current path of MOS transistor 5 is connected to sense amplifier 3. The other end of the current path is connected to a bit line (BL). Signal BLS is input to the gate of MOS transistor 5. Signal BLS is supplied by, for example, control circuit 10. MOS transistor 5 is also a high-withstand-voltage transistor.

The input/output pad group includes a plurality of pads (not shown). A power supply voltage Vcc, VSS (0 V), and other voltages are externally supplied to the individual pads. Voltages are externally applied to the flash memory 1 via the pads. Control circuit 10 supervises the operation of the entire flash memory 1. That is, control circuit 10 carries out necessary processes for reading, writing, and erasing data and further transfers various signals to the individual circuits.

<Planar Arrangement of NAND Flash Memory>

Next, a planar arrangement of the NAND flash memory configured as described above, especially the memory cell array 2, sense amplifier 3, row decoder 4, source line driver 6, well driver 7, short circuit 8, and input/output pad group 9, will be explained with reference to FIG. 3. FIG. 3 is a block diagram showing an arrangement of the above circuits. As for source line driver 5, only MOS transistor 12 is shown.

As shown in FIG. 3, sense amplifiers 3 are arranged in a second direction of the semiconductor substrate so as to sandwich memory cell array 2 between them. In FIG. 3, the upper sense amplifier is referred to as sense amplifier 3-1 and the lower one is referred to as sense amplifier 3-2. Sense amplifiers 3-1 and 3-2 are arranged so as to sandwich memory cell array 2 between them in a first direction perpendicular to the second direction. For example, sense amplifiers 3-1 are provided so as to correspond to even-numbered bit lines BL0, BL2, BL4, . . . Sense amplifiers 3-2 are provided so as to correspond to odd-numbered bit lines BL1, BL3, BL5, . . . When there is no need to distinguish between sense amplifiers 3-1, 3-2, they will simply be referred to as sense amplifiers 3.

Row decoders 4 are arranged in the first direction so as to sandwich memory cell array 2. In FIG. 3, the left row decoder is referred to as row decoder 4-1 and the right row decoder is referred to as row decoder 4-2. Row decoders 4-1, 4-2 are arranged so as to sandwich memory cell array 2 between them in the second direction. When there is no need to distinguish between row decoders 4-1, 4-2, they will simply be referred to as row decoders 4.

Input/output pad group 9, which is provided in the second direction, is arranged so as to sandwich sense amplifier 3-2 between the pad group 9 and memory cell array 2 in the first direction. That is, input/output pad group 9 is arranged closer to sense amplifier 3-2 than sense amplifier 3-1. In input/output pad group 9, a plurality of input/output pads 16 are arranged in the second direction.

The control circuits 10 are arranged so as to lie adjacent to four corners of memory cell array 2. In FIG. 3, the control circuits provided at the four corners are referred to as control circuits 10-1, 10-2, 10-3, and 10-4. Control circuit 10-1 is arranged adjacent to sense amplifier 3-1 and row decoder 4-1. Control circuit 10-2 is arranged adjacent to sense amplifier 3-1 and row decoder 4-2. Control circuit 10-3 is arranged adjacent to sense amplifier 3-2 and row decoder 4-1. Control circuit 10-4 is arranged adjacent to sense amplifier 3-2 and row decoder 4-2. When there is no need to distinguish between control circuits 10-1 to 10-4, they will simply be referred to as control circuits 10.

Source line driver 6 is arranged in a region between memory cell array 2 and sense amplifier 3-2. Specifically, MOS transistors 12 of source line driver 6 are provided between memory cell array 2 and sense amplifier 3-2. The gate of MOS transistors 12 is drawn to control circuit 10-3. Operational amplifier 13 provided in control circuit 10-3 supplies signal SRCDVSS to the gate.

Well driver 7 is arranged in a region between memory cell array 2 and sense amplifier 3-1. Specifically, MOS transistors 14 of well driver 7 are provided between memory cell array 2 and sense amplifier 3-1. The gate of MOS transistors 14 is drawn to control circuit 10-1. Control circuit 10-1 supplies signal WELVSS to the gate.

Short circuit 8 is also arranged in the region between memory cell array 2 and sense amplifier 3-1. Specifically, MOS transistors 15 of short circuit 8 are provided between memory cell array 2 and sense amplifier 3-1. The gate of MOS transistors 15 is drawn to control circuit 10-1. Control circuit 10-1 supplies signal SRCWEL to the gate.

With the above configuration, well lines WEL_L connected to p-well region where memory cell transistors MT have been formed and power lines VSS_L that transfer voltage VSS are formed into strips in the first direction. The interconnections are drawn to the region between memory cell array 2 and sense amplifier 3-1 and to the region between memory cell array 2 and sense amplifier 3-2. In the regions, MOS transistor 12 is connected to source line SL and power line VSS_L, MOS transistor 14 is connected to well line WEL_L and power line VSS_L, and MOS transistor 15 is connected to source line SL and well line WEL_L. Although the individual interconnections are overlapped with one another in FIG. 3 for convenience in drawing, which level the individual interconnections are arranged at and how they are crossed are not limited to FIG. 3.

<Planer and Cross-Section Structure of Memory Cell Array 2>

Figure 4:
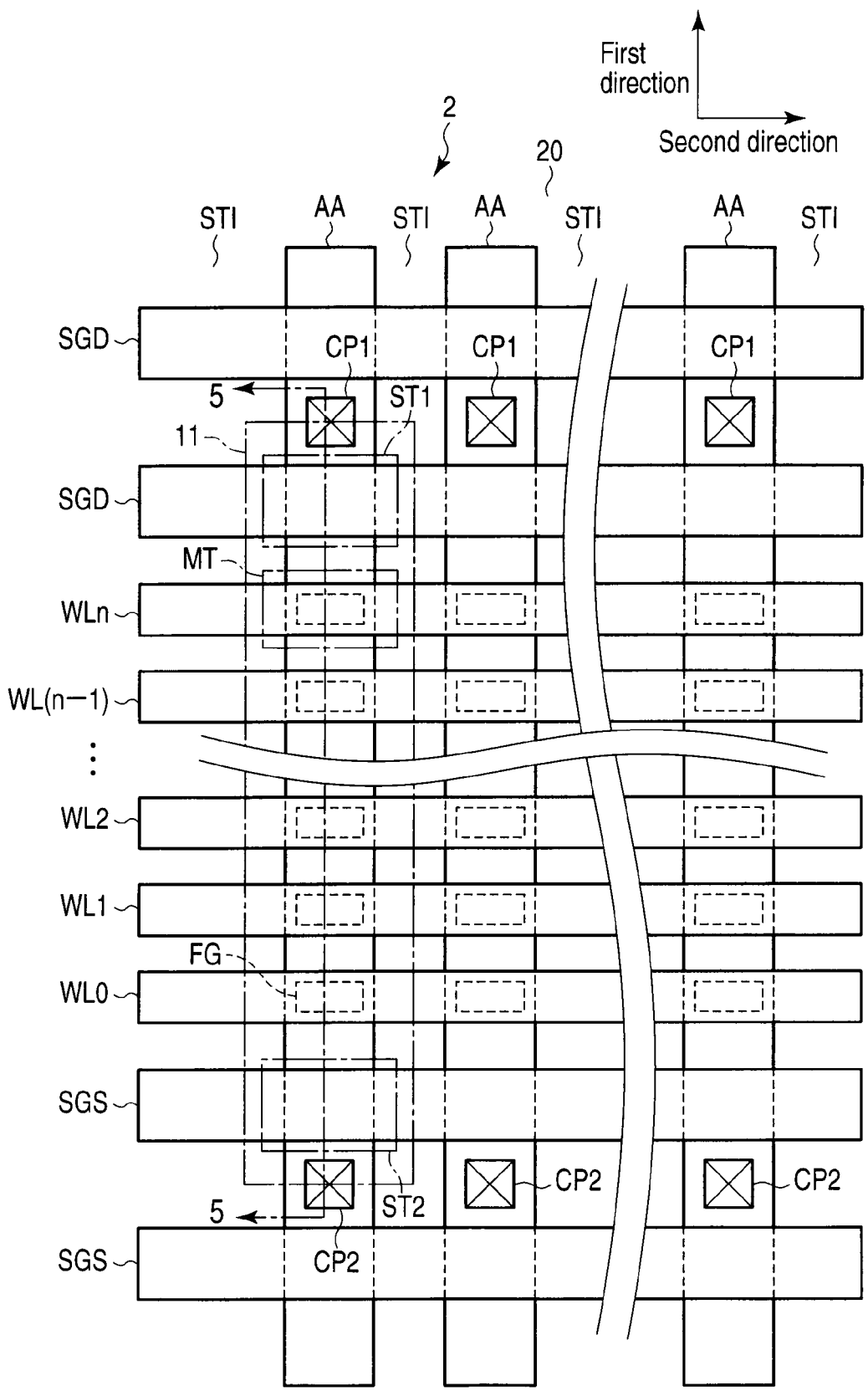
FIG. 4 is a plan view of a memory cell array according to the first embodiment.

Next, a planer and a cross-section structure of memory cell array 2 configured as described above will be explained. First, a planer structure of memory cell array 2 will be explained with reference to FIG. 4. FIG. 4 is a plan view of a part of memory cell array 10.

As shown in FIG. 4, a plurality of strips of element regions AA extending in the first direction are provided in the second direction in the semiconductor substrate 20. Between adjacent element regions AA, an element isolating region STI is formed. The element isolating regions STI separate element regions AA electrically. On the semiconductor substrate 20, strips of word lines WL and select gate lines SGD, SGS extending in the second direction are formed so as to cross over a plurality of element regions AA. In the regions where word lines WL cross element regions AA, floating gates FG are provided. In addition, memory cell transistors MT are provided in the regions where word lines WL cross element regions AA. Select transistors ST1 are provided in the regions where select gate lines SGD cross element regions AA. Select transistors ST2 are provided in the regions where select gate lines SGS cross element regions AA. In element regions AA between adjacent word lines, between adjacent select gate lines, between word line and select gate lines in the first direction, impurity diffused layers functioning as the source regions or drain regions of memory cell transistors MT and select transistors ST1, ST2 have been formed.

An impurity diffused layer formed in the element region AA between select gate lines SGD adjacent to each other in the first direction functions as the drain region of select transistor ST1. On the drain region, a contact plug CP1 is formed. Contact plug CP1 is connected to a strip of bit line BL (not shown) provided in the first direction. An impurity diffused layer formed in the element region AA between select gate lines SGS adjacent to each other in the first direction functions as the source region of select transistor ST2. On the source region, a contact plug CP2 is formed. Contact plug CP2 is connected to a source line (not shown).

Figure 5:
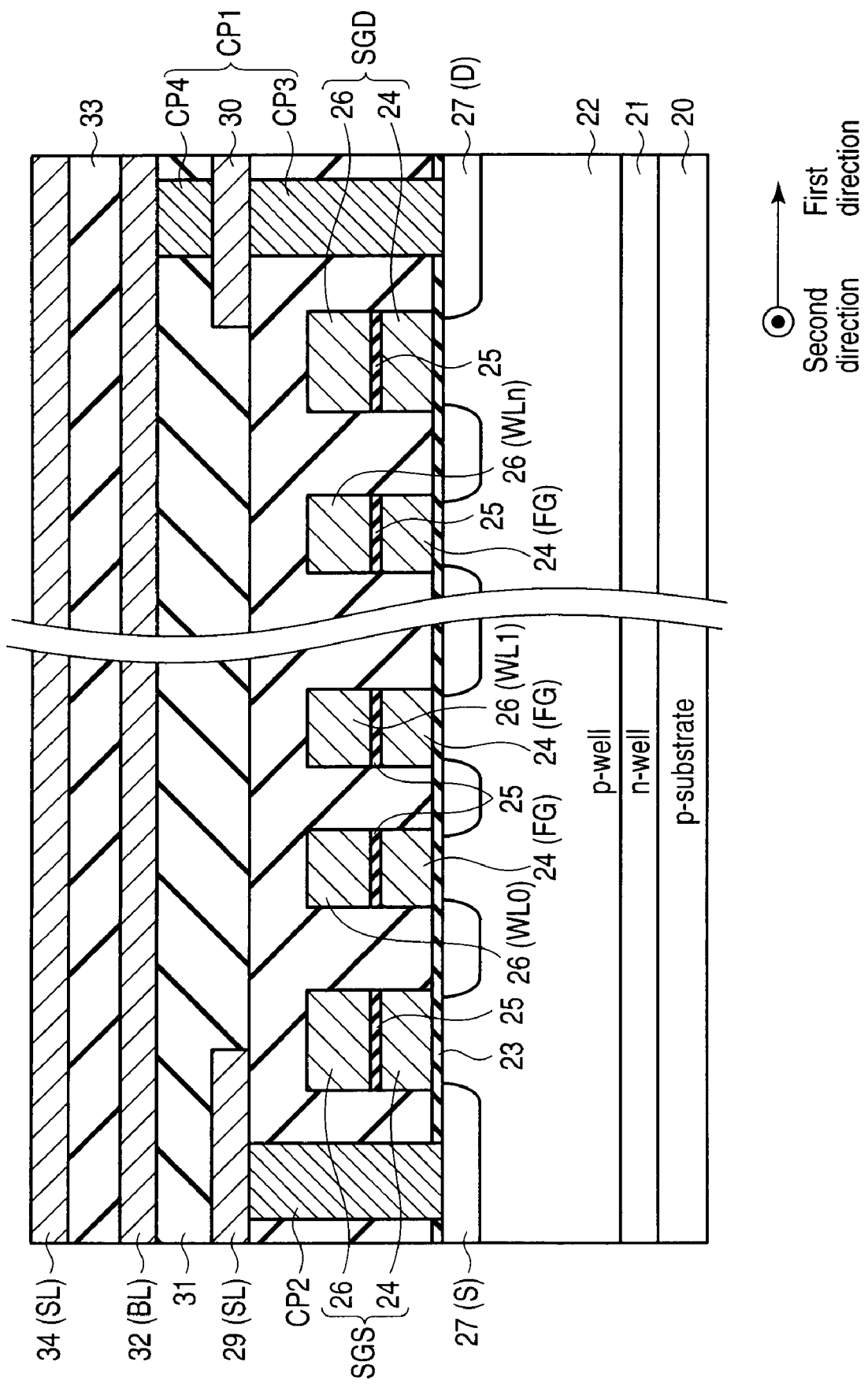
FIG. 5 is a sectional view taken along line 5-5 of FIG. 4.

Next, a cross-section structure of memory cell array 2 configured as described above will be explained with reference to FIG. 5. FIG. 5 is a sectional view taken along a bit line of NAND string 11 (in the first direction) or taken along line 5-5 of FIG. 4.

As shown in FIG. 5, an n-well region 21 is formed in the surface of a p-type semiconductor substrate 20 and a p-well region 22 is formed in the surface of the n-well region 21. On the p-well region 22, a gate insulating film 23 is formed. On the gate insulating film 23, the gate electrodes of memory cell transistor MT and select transistors ST1, ST2 are formed. Each of the gate electrodes of the memory cell transistors MT and select transistors ST1, ST2 includes a polysilicon layer 24 formed on the gate insulating film 23, an inter-gate insulating film 25 formed on the polysilicon layer 24, and a polysilicon layer 26 formed on the inter-gate insulating film 25. The inter-gate insulating film 25 is formed of, for example, a silicon dioxide film, or an ON, an NO, or an ONO film which have a stacked structure of a silicon dioxide film and a silicon nitride film, or a stacked structure including those, or a stacked structure of a $TiO_2$, $HfO_2$, $AL_2O_3$, HfAlOx, or HfAlSi film and a silicon dioxide or a silicon nitride film. Gate insulating film 23 functions as a tunnel insulating film.

In the memory cell transistors MT, the polysilicon layers 24 function as floating gates (FG). The polysilicon layers 26 adjacent in the direction perpendicular to the bit line are connected to each other and function as a control gate electrode (word line WL). In the select transistors ST1, ST2, the polysilicon layers 24, 26 adjacent in the direction of the word line are connected to each other. The polysilicon layers 24, 26 function as select gate lines SGS, SGD. Only the polysilicon layers 24 may function as select gate lines. In this case, the polysilicon layers 26 of the select transistors ST1, ST2 are set at a specific potential or in a floating state. At the surface of the semiconductor substrate 20 between gate electrodes, an $n^+$-type impurity diffused layer 27 is formed. The impurity diffused layer 27, which is shared by adjacent transistors, functions as a source (S) or a drain (D). The region between a source and a drain adjacent to each other functions as a channel region serving as an electron moving region. These gate electrodes, impurity diffused layers 27, and channel regions form MOS transistors which function as memory cell transistors MT and select transistors ST1, ST2.

On the semiconductor substrate 20, an interlayer insulating film 28 is formed so as to cover the memory cell transistors MT and select transistors ST1, ST2. In the interlayer insulating film 28, a contact plug CP2 reaching the impurity diffused layer (source S) 27 of select transistor ST2 on the source side is formed. On the interlayer insulating film 28, a first-level metal interconnection layer 29 connected to the contact plug CP2 is formed. The metal interconnection layer 29 functions as a part of the source line SL. Further, in the interlayer insulating film 28, a contact plug CP3 reaching the impurity diffused layer (drain) 27 of select transistor ST1 on the drain side is formed. On the interlayer insulating film 28, a first-level metal interconnection layer 30 connected to the contact plug CP3 is formed.

On the interlayer insulating film 28, an interlayer insulating film 31 is formed so as to cover the metal interconnection layers 29, 30. In the interlayer insulating film 31, a contact plug CP4 reaching the metal interconnection layer 30 is formed. On the interlayer insulating film 31, a second-level metal interconnection layer 32 connected to a plurality of contact plugs CP4 in common is formed. The metal interconnection layer 32 functions as a bit line BL. The contact plugs CP3, CP4, and metal interconnection layer 30 correspond to the contact plugs CP1 of FIG. 4.

On the interlayer insulating film 31, an interlayer insulating film 33 is formed so as to cover the metal interconnection layer 32. On the interlayer insulating film 33, a third-level metal interconnection layer 34 is formed so as to cover the top of memory cell array 2. The metal interconnection layer 34, which functions as, for example, the source line SL explained in FIG. 3, is connected to the metal interconnection layer 29 in a region that is not shown in the drawing.

In memory cell array 2, some of the element regions AA serve as shunt regions. In the shunt regions, the same configuration as that of NAND string 11 shown in FIG. 5 is provided. The configuration in the shunt regions is not for holding data but for a dummy. In the shunt regions, the contact plugs make contact with the well region 22, metal interconnection layers 29, 34, or the like.

For example, in a shunt region, the impurity diffused layer 27 is removed in the structure of FIG. 5 and the contact plug CP3 is in contact with the well region 22. The metal interconnection layer 32 functions not as a bit line BL but as a well line WEL_L. In another shunt region, contact plug CP1 is eliminated and the metal interconnection layer 32 functions as a power line VSS_L for transferring voltage VSS. In still another shunt region, contact plug CP1 is removed and the metal interconnection layers 29 and 34 are connected to each other via the metal interconnection layer 32.

The third-level metal interconnection layer 34 also functions as a source line SL in a region on the memory cell array 2 and is connected to the metal interconnection layer 29 in a shunt region. In another region, the metal interconnection layer 34 functions as a well line WEL_L and is connected to the well region 22 via the metal interconnection layer 32 and contact plug CP1 in a shunt region. In still another region, the metal interconnection layer 34 functions as a power line VSS_L.

<Planar and Cross-Section Structure of Well Driver 7 and Short Circuit 8>

Figure 6:
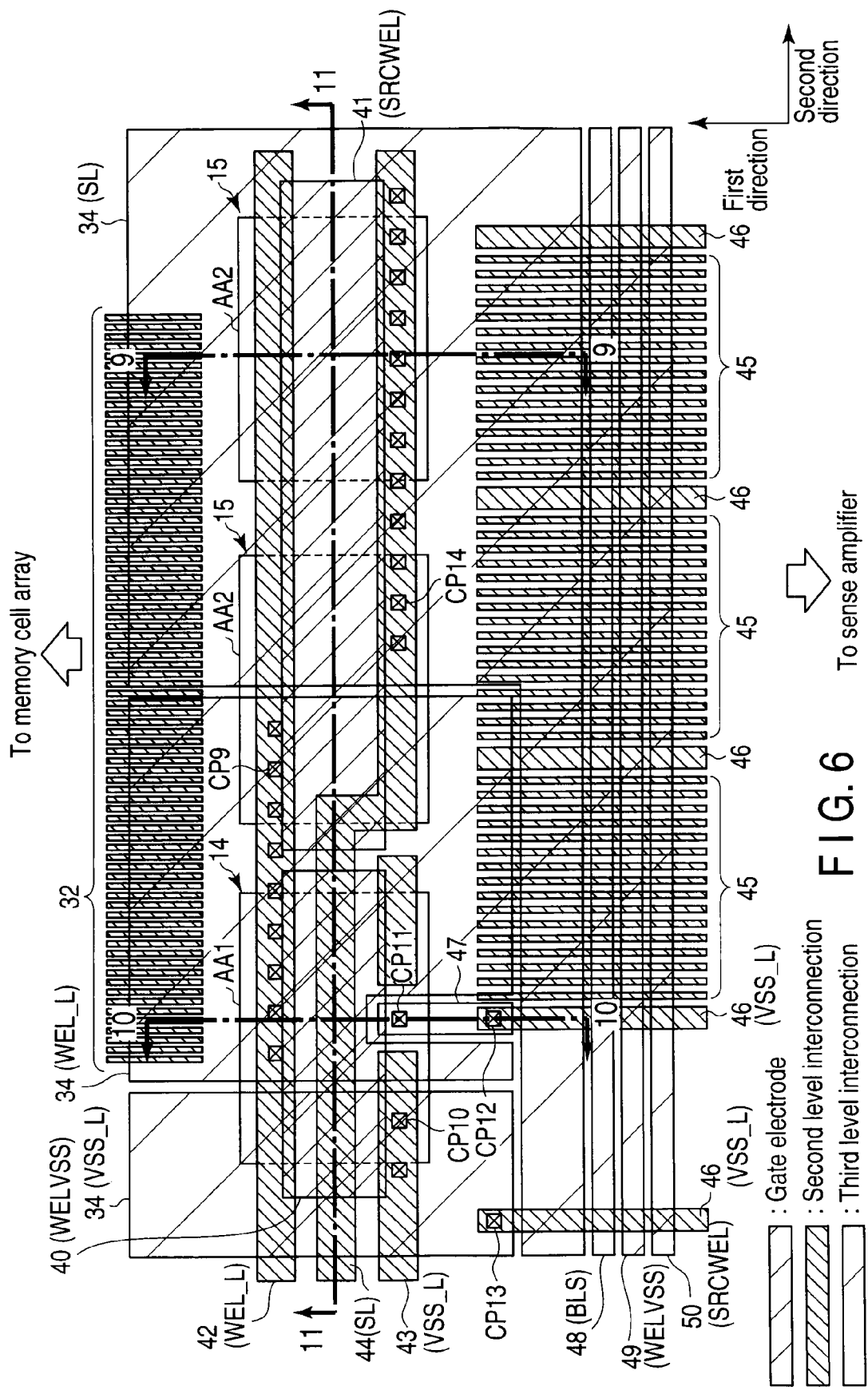
Figure 8:
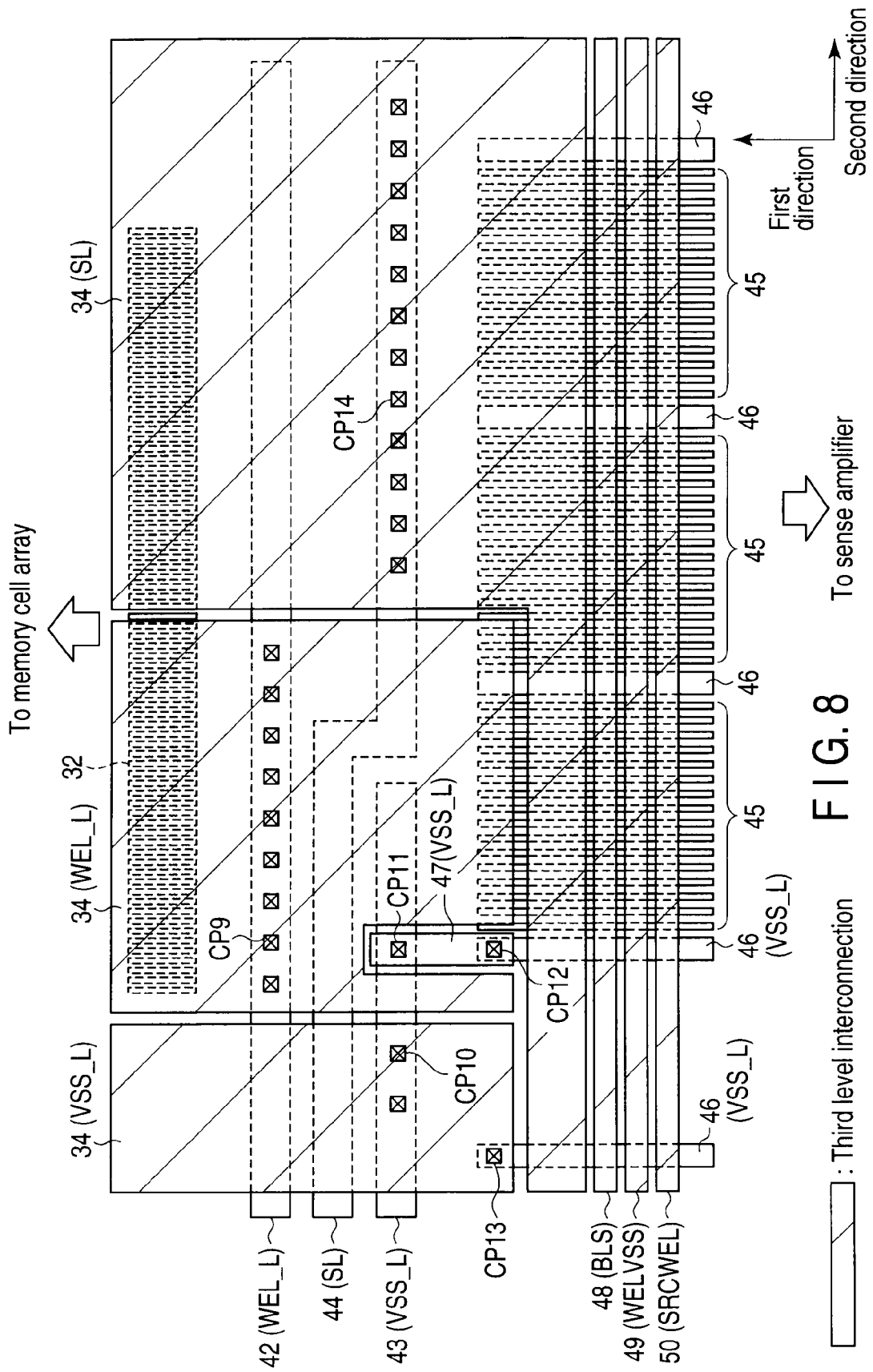

Next, a planar and a cross-section structure of well driver 7 and short circuit 8 will be explained. First, the planar structure will be explained with reference to FIGS. 6 to 8. FIG. 6 is a plan view of a region between sense amplifier 3-1 and memory cell array 2 of FIG. 3. FIGS. 7 and 8 show the same region as that of FIG. 6 to facilitate the understanding of multilevel interconnections. FIG. 7 shows a plane pattern of an element region, gate electrodes, and a second-level metal interconnection layer provided above the element region and gate electrodes. FIG. 8 shows a plane pattern of a third-level metal interconnection layer provided above the second-level metal interconnection layer. In FIGS. 7 and 8, the shaded regions are the second-and third-level metal interconnection layers, respectively. To simplify the drawing, the first-level metal interconnection layer under the second-level metal interconnection layer is not shown.

First, the configuration of semiconductor substrate 20 will be explained with reference to FIGS. 6 and 7. As shown in FIGS. 6 and 7, element regions AA1, AA2 are provided in semiconductor substrate 20. Element regions AA1, AA2 are arranged in the second direction. An element isolating region STI (not shown) is formed between element regions. The element isolating regions STI electrically separate the element regions from one another. Although one element region AA1 and two element regions AA2 are shown in FIGS. 6 and 7, the number of element regions AA1 and that of element regions AA2 are not limited to those numbers.

On element region AA1, strips of gate electrodes 40 are formed in the second direction and further an impurity diffused layer (not shown) is formed. These form a MOS transistor 14 of the well driver 7.

On element region AA2, strips of gate electrodes 41 are formed in the second direction and further an impurity diffused layer (not shown) is formed. These form a MOS transistor 15 of the short driver 8.

Next, second-level metal interconnection layers will be explained with reference to FIGS. 6 and 7. On element region AA1, strips of second-level metal interconnection layers 42, 43 are provided in the second direction. The metal interconnection layer 42 is electrically connected to the well region 22 and functions as a well line WEL_L. The metal interconnection layer 42 is connected to the drain of MOS transistor 14 with the contact plug CP5. VSS is applied to the metal interconnection layer 43, which functions as a power line VSS_L. The metal interconnection layer 43 is connected to the source of MOS transistor 14 with the contact plug CP6.

The metal interconnection layer 42 extends to element region AA2. On element region AA2, strips of second-level metal interconnection layers 44 are provided in the second direction and pass over the gate electrode 40 on element AA1. The metal interconnection layer 44 is electrically connected to the metal interconnection layer 49 (see FIG. 5) and functions as a source line SL. The metal interconnection layer 44 is connected to an impurity diffused layer functioning as one end of the current path of MOS transistor 15 with a contact plug CP8. The metal interconnection layer 42 is connected to an impurity diffused layer functioning as the other end of the current path of MOS transistor 15 with a contact plug CP7.

The second-level metal interconnection layer 32 in memory cell array 2 is drawn to the boundary part between memory cell array 2 and sense amplifier 3-1. As described above, the metal interconnection layer 32 functions as bit line BL, well line WEL_L, or power line VSS_L (a part of metal interconnection layer 32 may function as source line SL). The second-level metal interconnection layers 45, 46 in sense amplifier 3-1 are drawn to the boundary part. The corresponding ones of the metal interconnection layers 32 and 45 are connected to one another with a first-level metal interconnection layer. That is, the metal interconnection layer 45 also functions as bit line BL, well line WEL_L, or power line VSS_L. The metal interconnection layer 46 functions as, for example, power line VSS_L or a transmission line for other necessary signals.

Next, a third-level metal interconnection layer will be explained with reference to FIGS. 6 and 8. As shown in FIGS. 6 and 8, the third-level metal interconnection layer 34 in memory cell array 2 is also drawn to the boundary part between memory cell array 2 and sense amplifier 3-1.

The metal interconnection layer 34 functioning as source line SL, well line WEL_L, or power line VSS_L is provided so as to cover the top surface of the MOS transistors 14, 15. The metal interconnection layer 34 functioning as source line SL is connected to the second-level metal interconnection layer 44 with a contact plug CP14. The metal interconnection layer 34 functioning as well line WEL_L is connected to the second-level metal interconnection layer 42 with a contact plug CP9. The metal interconnection layer 34 functioning as power line VSS_L is connected to the second-level metal interconnection layer 43 with a contact plug CP10. The metal interconnection layer 34 is further connected to the metal interconnection layer 46 functioning as power line VSS_L with a contact plug CP13. The metal interconnection layer 43 is also connected to the metal interconnection layer 46 functioning as power line VSS_L via a contact plug CP11, a third-level metal interconnection layer 47, and a contact plug CP12.

Furthermore, strips of third-level metal interconnection layers 48 to 50 are provided in the second direction. The metal interconnection layers 48 to 50 function as transmission lines for signals BLS, WELVSS, and SRCWEL.

In the example of MOS transistors 14, 15 shown in FIGS. 6 to 8, the impurity diffused layer closer to memory cell array 2 is connected to well line WEL_L, and the impurity diffused layer closer to sense amplifier 3-1 is connected to power line VSS_L or source line SL. However, the embodiments are not limited to this example.

Figure 9:
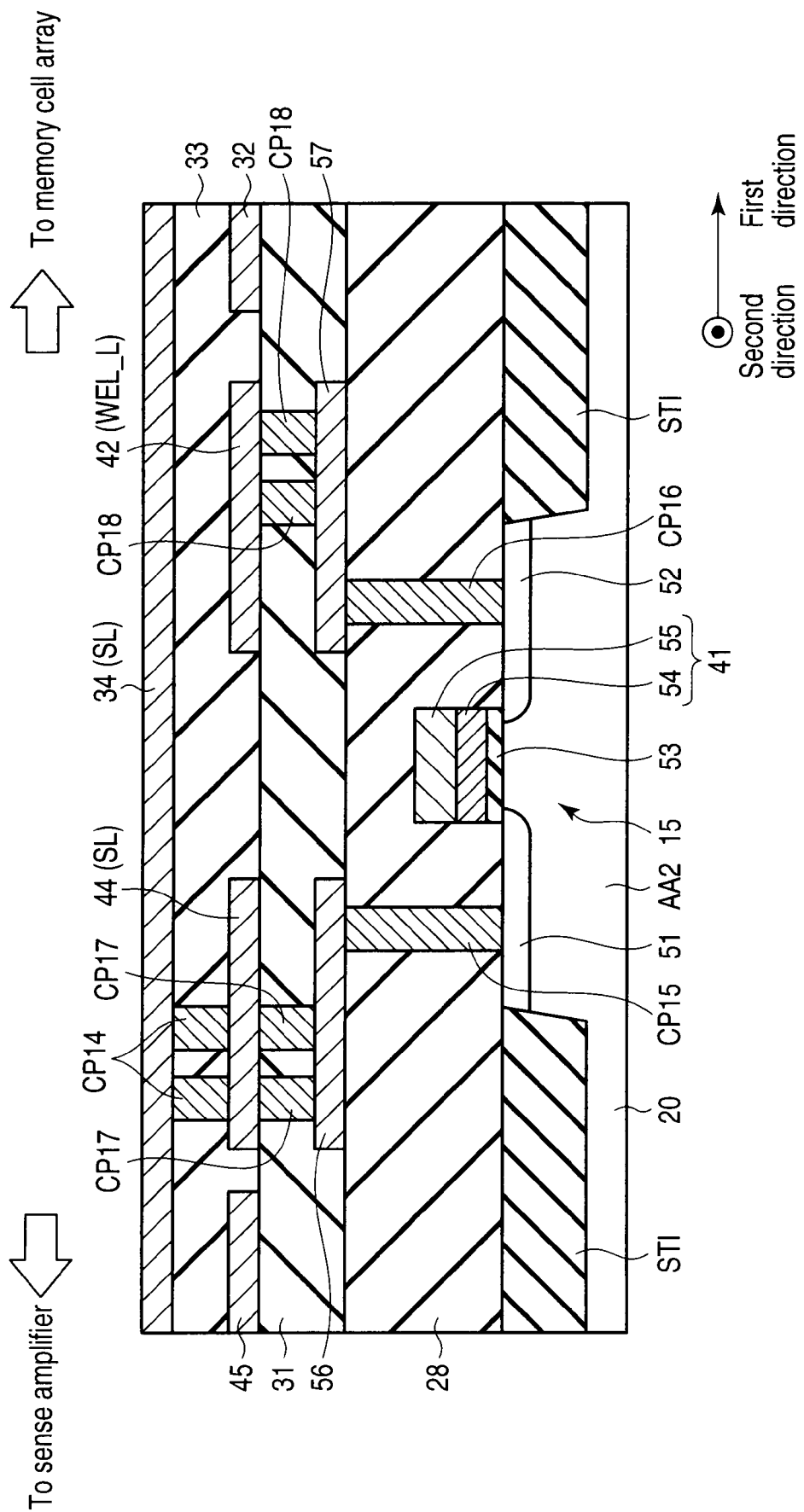
Figure 11:
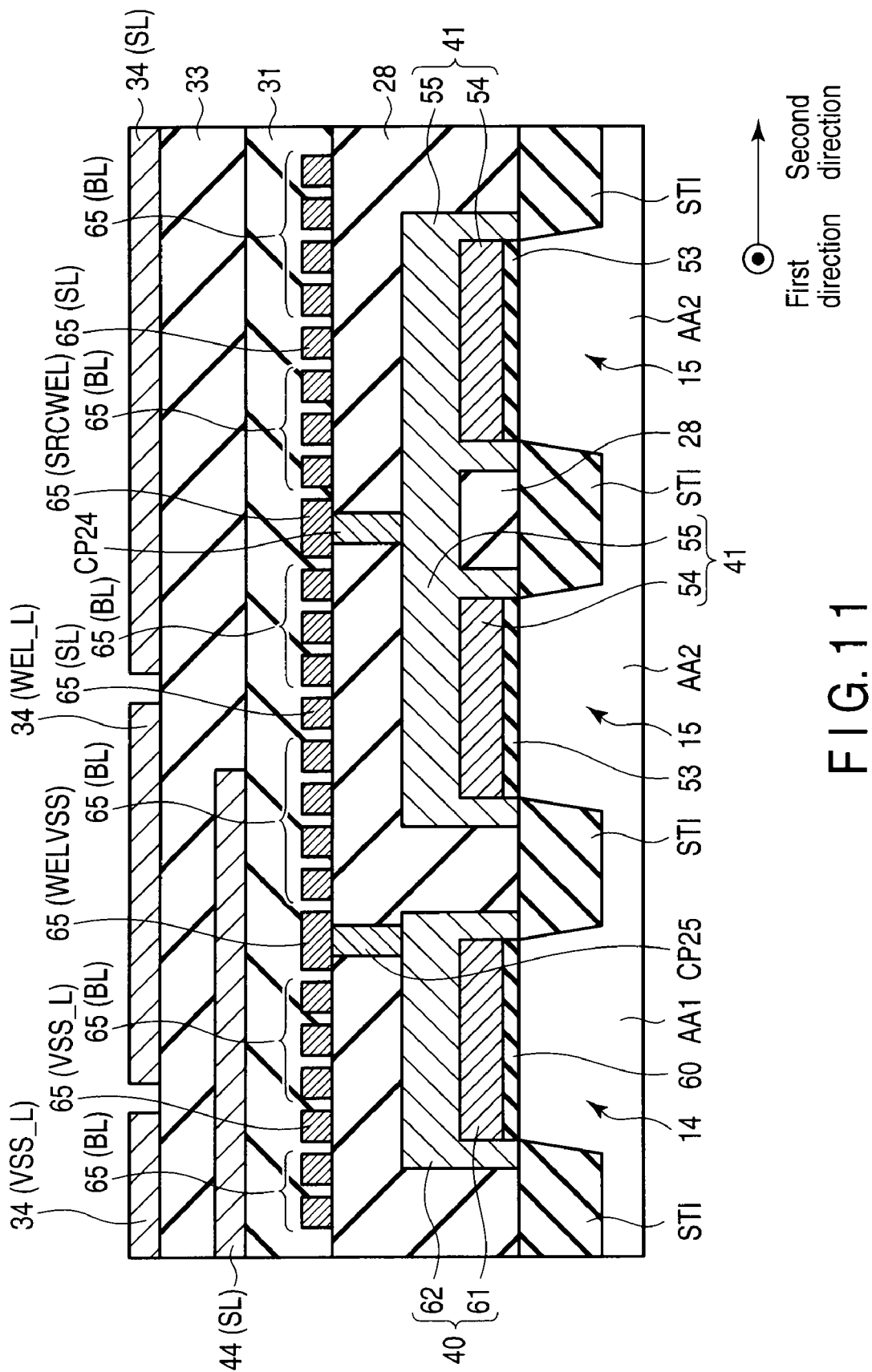

Next, a cross-section structure of well driver 7 and short circuit 8 configured as described above will be explained with reference to FIGS. 9 to 11. FIGS. 9 to 11 are sectional views taken along line 9-9, line 10-10, and line 11-11 of FIG. 6, respectively.

As shown in FIGS. 9 to 11, in the semiconductor substrate 20, element regions AA1, AA2 are formed. Element isolating regions STI surround element regions AA1, AA2. In the surface of element region AA2, impurity diffused layers 51, 52 functioning as one and the other end of the current path of each of the MOS transistors 15 are formed so as to be separate from each other. On the semiconductor substrate 20 between the impurity diffused layers 51, 52, a gate electrode 41 is formed with a gate insulating film 53 interposed therebetween. The gate electrode 41 has such a structure as has, for example, polysilicon layers 54, 55 stacked in that order. The polysilicon layers 54, 55 may be formed simultaneously with the polysilicon layers 24, 26 of the memory cell transistors MT and select transistors ST1, ST2. The gate electrode 41 is formed so as to cross over two element regions AA2. More specifically, the polysilicon layer 54 is formed on each of the element regions AA2. The polysilicon layer 55 is formed so as to surround the two polysilicon layers 54 in the second direction.

In the surface of element region AA1, impurity diffused layers 58, 59 functioning as the source and drain of each of the MOS transistors 14 are formed so as to be separate from each other. On the semiconductor substrate 20 between the impurity diffused layers 58, 59, a gate electrode 40 is formed with a gate insulating film 60 interposed therebetween. The gate electrode 40 has such a structure as has, for example, polysilicon layers 61, 62 stacked in that order. The polysilicon layers 61, 62 may be formed simultaneously with the polysilicon layers 24, 26 of the memory cell transistors MT and select transistors ST1, ST2. The polysilicon layer 62 is formed so as to surround the polysilicon layer 61 in the second direction.

An interlayer insulating film 28 is formed on the semiconductor substrate 20 so as to cover the MOS transistors 14, 15. In the interlayer insulating film 28, contact plugs CP15, CP16, CP19, CP20, CP24, CP25 are formed. The contact plugs CP15, CP16 are connected to the impurity diffused layers 51, 52, respectively. The contact plug CP24 is connected to a polysilicon layer 55. The contact plugs CP19, CP20 are connected to the impurity diffused layers 58, 59, respectively. The contact plug CP25 is connected to the polysilicon layer 62.

On the interlayer insulating film 28, first-level metal interconnection layers 56, 57, 63 to 65 are formed. The metal interconnection layers 56, 57 are connected to the contact plugs CP15, CP16 of MOS transistor 15, respectively. The metal interconnection layers 63, 64 are connected to the contact plugs CP19, CP20 of MOS transistor 14, respectively. A plurality of strips of metal interconnection layers 65 are provided in the second direction. The metal interconnection layer 65 functions as bit line BL, power line VSS_L, source line SL, or a transmission line for signal WELVSS or SRCWEL. The metal interconnection layer 65 functioning as bit line BL, power line VSS_L, or source line SL is connected to the metal interconnection layers 32, 45 in a region (not shown). That is, the metal interconnection layers 32 and 45 are electrically connected to each other via the metal interconnection layer 65. The metal interconnection layer 65 functioning as a transmission line for signal WELVSS or SRCWEL is connected to, for example, control circuit 10 in a region (not shown) and further connected to the contact plugs CP25, CP24.

On the interlayer insulating film 28, an interlayer insulating film 31 is formed so as to cover the metal interconnection layers 56, 57, 63 to 65. In the interlayer insulating film 31, contact plugs CP17, CP18, CP21, CP22 are formed. The contact plugs CP17, CP18 are connected to the metal interconnection layers 56, 57, respectively. The contact plugs CP21, CP22 are connected to the metal interconnection layers 63, 64, respectively.

On the interlayer insulating film 31, second-level metal interconnection layers 32, 42 to 46 are formed. The metal interconnection layer 44 functioning as source line SL is connected to the contact plug CP17. The metal interconnection layer 43 functioning as power line VSS_L is connected to the contact plug CP21. The metal interconnection layer 42 functioning as well line WEL_L is connected to the contact plugs CP18, CP22. That is, the contact plug CP5 of FIG. 7 corresponds to the metal interconnection layer 64 and contact plugs CP20, CP22. The contact plug CP6 corresponds to the metal interconnection layer 63 and contact plugs CP19, CP21. The contact plug CP7 corresponds to the metal interconnection layer 57 and contact plugs CP16, CP18. The contact plug CP8 corresponds to the metal interconnection layer 56 and contact plugs CP15, CP17.

On the interlayer insulating film 31, an interlayer insulating film 33 is formed so as to cover the metal interconnection layers 32, 42 to 46. On the interlayer insulating film 33, third-level metal interconnection layers 34, 47 are formed. In the interlayer insulating film 33, contact plugs CP9, CP11, CP12, CP14 are formed. The metal interconnection layer 44 is connected to the metal interconnection layer 34 functioning as a source line with the contact plug CP14. The metal interconnection layer 42 is connected to the metal interconnection layer 34 functioning as well line WEL_L with the contact plug CP9. The metal interconnection layer 47 is connected to the metal interconnection layer 43 with the contact plug CP11 and further connected to the metal interconnection layer 46 with the contact plug CP12.

<Read Operation of NAND Flash Memory>

Next, a read operation of the NAND flash memory configured as described above will be explained. A verify operation performed in writing or erasing data is the same as a read operation explained below.

<<Voltages of Various Signal Lines>>

Figure 12:
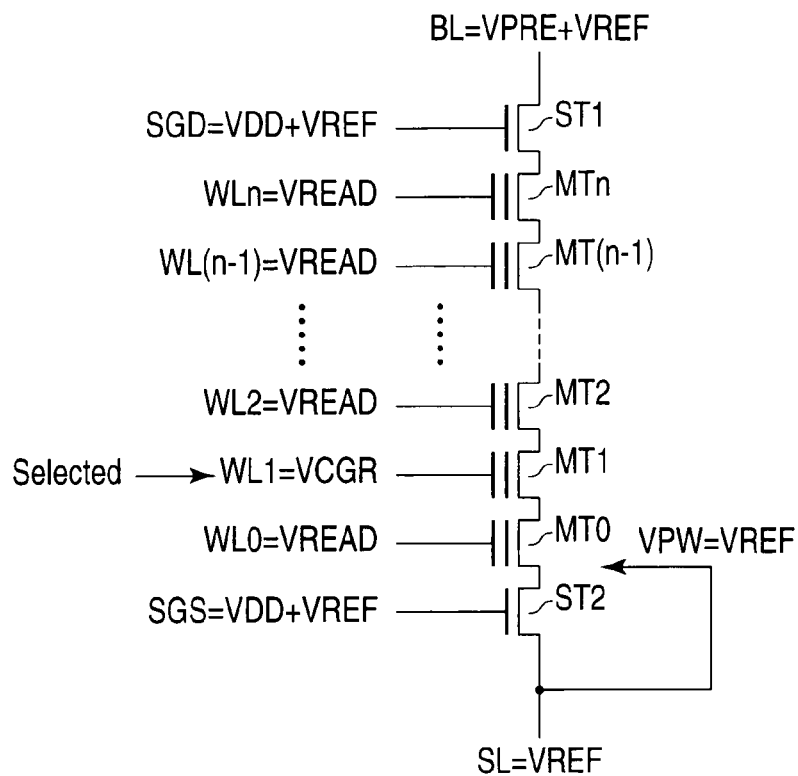
FIGS. 12 and 13 are a circuit diagram and a sectional view of a NAND string according to the first embodiment.

The relationship between the voltages of various signal lines in a read operation will be explained with reference to FIG. 12. FIG. 12 is a circuit diagram of NAND string 11 in a read operation. Hereinafter, explanation will be given, taking as an example a case where data is read from the memory cell transistors MT connected to word line WL1.

First, sense amplifier 3 (not shown) precharges all the bit lines BL via the current path of MOS transistor 5. Source line driver 6 applies voltage VREF to source line SL. VREF is, for example, a positive voltage. Control circuit 10 makes signal SRCWEL high, thereby turning on MOS transistor 15. As a result, short circuit 8 short-circuits source line SL with well region 22. Accordingly, the potential VPW of well region 22 becomes equal to that of source line SL, or VREF.

Row decoder 4 selects word line WL1 and applies read voltage VCGR to the selected word line WL1. In addition, row decoder 4 applies voltage VREAD to the unselected word lines WL0, WL2 to WLn. Moreover, row decoder 4 applies voltage (VDD+VREF) to select gate lines SGD, SGS.

Voltage VREAD is a voltage that turns on memory cell transistors MT, regardless of data to be held. Voltage VCGR is a voltage that is applied to a memory cell transistor to be read from and is varied, depending on data to be read. Voltage (VDD+VREF) applied to select gate lines SGD, SGS is a voltage that can turn on select transistors ST1 ST2.

As a result, the memory cell transistors MT connected to the unselected word lines WL0, WL2 to WLn are turned on, forming a channel. In addition, select transistors ST1, ST2 are also turned on.

Then, when memory cell transistor MT connected to the selected word line WL1 goes on, this brings bit line BL and source line SL into an electrically conducting state. That is, current flows from bit line BL to source line SL. If memory cell transistor MT is off, bit line BL and source line SL are in an electrically nonconducting state. That is, no current flows from bit line BL to source line SL. By the above operation, data is read from all the bit lines simultaneously.

<<Voltages of Memory Cell Transistor>>

Figure 13:
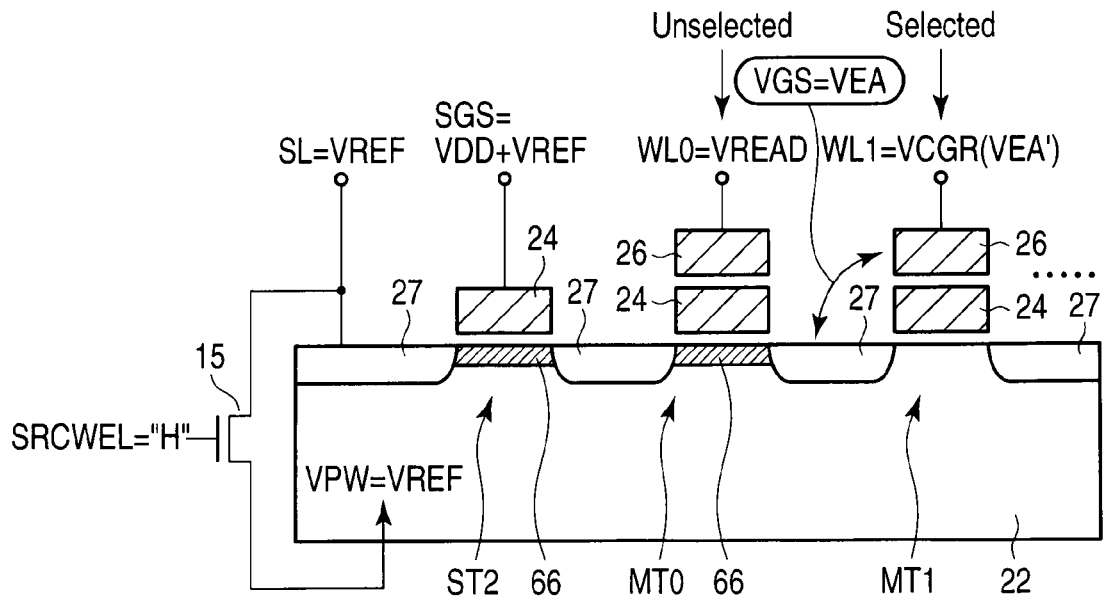

Next, the relationship between the voltages of memory cell transistor MT will be explained with reference to FIG. 13, taking as an example a case where data at level "Er" is read. FIG. 13 is a sectional view of a part of NAND string 11.

As shown in FIG. 13, voltage VREF is applied to source line SL and well region 22. Voltage (VDD+VREF) is applied to select gate line SGS and voltage VREAD is applied to word line WL0. Consequently, channel 66 is formed at each of select transistor ST2 and memory cell transistor MT0. The same holds true for select transistor ST1 and memory cell transistors MT2 to MTn. Voltage VCGR is applied to the selected word line WL1. If the read level is negative, the value of voltage VCGR is a value obtained by subtracting the absolute value of the read level from voltage VREF. That is, when data at level "Er" is read, it follows that voltage VCGR=VEA'=(VREF−|VEA|) (see FIG. 2), and is preferably a value not less than zero. For example, if voltage VREF=|VEA|, it follows that voltage VCGR=VEA'=0 V.

Accordingly, in memory cell transistor MT1, voltage VER (<0 V) is applied as gate-source voltage VGS. If data held by memory cell transistor MT1 is not lower than level "A", memory cell transistor MT1 goes off, preventing cell current from flowing. Conversely, if memory cell transistor MT1 goes on, it is seen that data held by transistor MT1 is at level "Er".

If the read level is zero or positive, the value of voltage VCGR is a value obtained by adding the read level to voltage VREF. That is, when level "A" is read, or when it is determined whether the read data is not higher than level "A" or not lower than level "B", it follows that voltage VCGR=VAB'=VREF since VAB=0 V (see FIG. 2). When level "B" is read, or when it is determined whether the read data is not higher than level "B" or equal to level "C", it follows that voltage VCGR=VBC'=(VREF+VBC).

Figure 14:
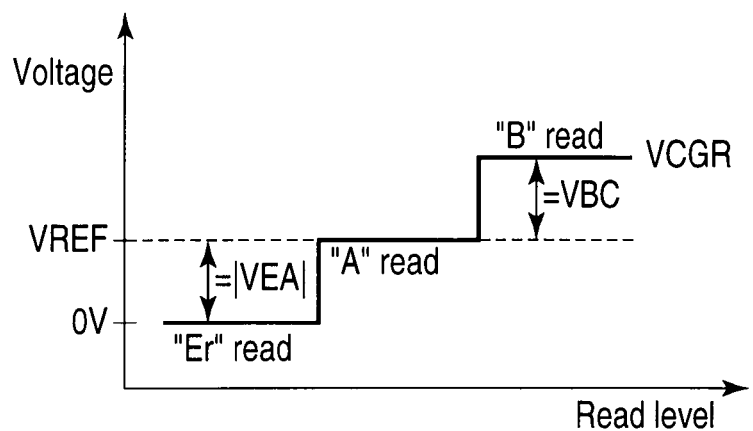
FIG. 14 is a graph of a read voltage according to the first embodiment.

FIG. 14 is a graph showing the relationship between the read levels and voltage VCGR. As shown in FIG. 14, when data whose read level is negative is read, a value obtained by subtracting the absolute value of the read level from VREF is set as VCGR. When data whose read level is positive is read, a value obtained by adding the read level to VREF is set as VCGR. By doing this, a voltage at the read level can be applied between the gate and source of memory cell transistor MT, while VCGR is constantly kept at a value not less than 0.

<Write Operation of NAND Flash Memory>

Next, a write operation in the NAND flash memory according to the first embodiment will be explained briefly.

Figure 15:
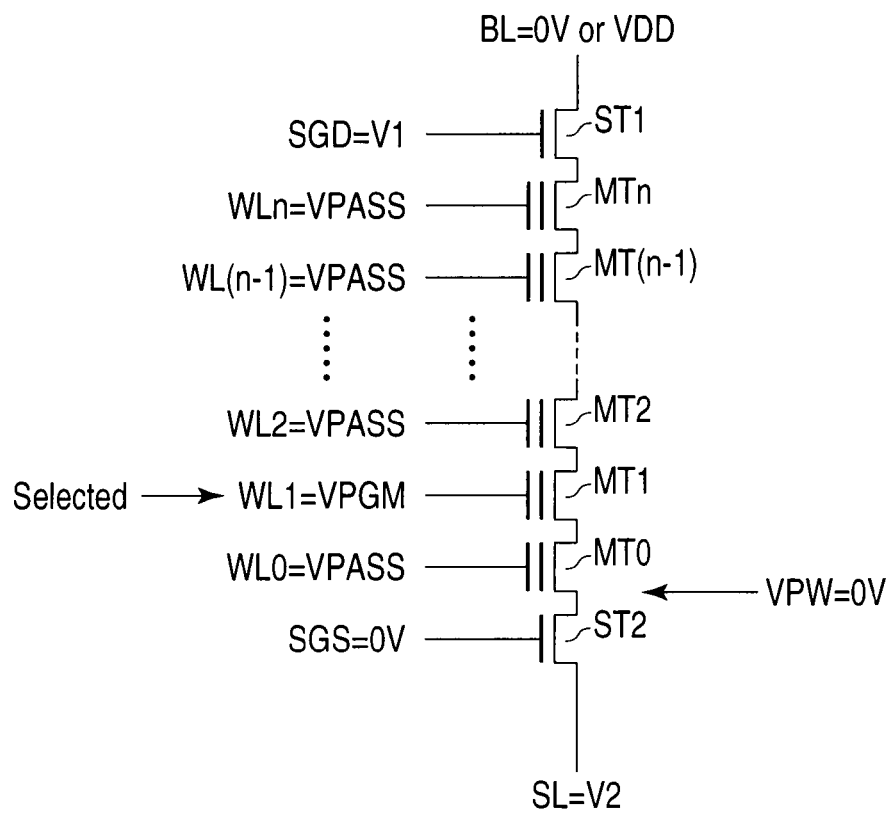
FIG. 15 is a circuit diagram of a NAND string according to the first embodiment.

FIG. 15 is a circuit diagram of NAND string 11 in a write operation. Hereinafter, explanation will be given taking as an example a case where data is written into memory cell transistor MT connected to word line WL1.

First, sense amplifier 3 (not shown) transfers data to all the bit lines BL via the current paths of MOS transistors 5. More specifically, sense amplifier 3 applies a write voltage (e.g., 0 V) to a bit line BL (referred to as the selected bit line) to which memory cell transistor MT (referred to as the selected memory cell) whose threshold voltage is to be raised by injecting charges into the charge accumulation layer is connected. A write inhibit voltage VDD (>0 V) is applied to a bit line BL (referred to as an unselected bit line) to which memory cell transistor MT (referred to as an unselected memory cell) whose threshold voltage is not to be raised is connected.

Row decoder 4 selects word line WL1 and applies program voltage VPGM to the selected word line WL1. Row decoder 4 further applies voltage VPASS to the unselected word lines WL0, WL2 to WLn. Row decoder 4 also applies voltage V1 to select gate line SGD and 0 V to select gate line SGS.

Voltage VPGM is a high voltage (e.g., 20 V) for injecting charges into the charge accumulation layer by FN (Fowler-Nordheim) tunneling. Voltage VPASS is a voltage that turns on memory cell transistor MT, regardless of data to be held. Voltage V1 is a voltage that causes select transistor ST1 to allow 0 V to pass but prevent VDD from passing. Accordingly, select transistor ST1 connected to the selected bit line goes on, whereas select transistor ST1 connected to an unselected bit line goes off.

As a result, the channel of the selected memory cell is at 0 V, producing a high voltage difference between the control gate and channel. Therefore, charges are injected into the charge accumulation layer, raising the threshold voltage. On the other hand, the channel of an unselected memory cell is electrically floating and rises in potential almost to the same level as that of the control gate. As a result, the injection of charges into the charge accumulation layer is suppressed, preventing the threshold voltage from increasing.

After the program operation, the aforementioned verify operation is carried out, thereby checking whether the desired data has been written. The program operation and verify operation are repeated until the desired data has been written.

During the program operation, potential VPW of well region 22 is kept at, for example, 0 V and the potential of source line SL is kept at a certain potential V1. Potential V1 may be 0 V. If V1=VPW, MOS transistor 15 of short circuit 8 may be turned on.

<Effect>

As described above, with the semiconductor memory device according to the first embodiment, the operation stability of a NAND flash memory can be improved. This effect will be explained in detail.

In the memory cells of a NAND flash memory, a negative threshold region can be used for the threshold values of program cells to use a wider threshold range. In a NAND flash memory, a memory cell in an erased state generally has a negative threshold value. To program a memory cell in an erased state to a program level with a negative threshold (in the example of FIG. 2, program from level "Er" to level "A"), two methods can be considered. One method is to perform a verify operation by applying a negative voltage to word lines. The other method is to virtually realize a negative gate-source voltage VGS by applying a positive voltage to the source line and the well of the memory cell (referred to as a cell well) while applying a positive voltage to the word lines, thereby enabling a verify operation in a negative threshold region.

The latter one is the method explained in the read operation of the NAND flash memory. In this method, it is necessary to short-circuit the two nodes to set the source line and cell well at the same potential. However, when a voltage drop in the interconnections for short-circuiting the two nodes becomes greater, the potential difference between the source line and cell well becomes larger. As a result, erroneous writing (erroneous reading) is liable to take place, which might lead to the degradation of the operation stability of the NAND flash memory.

For example, in the configuration of FIG. 3, when MOS transistor 14 is provided in control circuit 10, the source line and the interconnection of the cell well have to be drawn to control circuit 10, with the result that a voltage drop in the interconnections reaches a nonnegligible level.

It is desirable for the source line and the interconnection of the cell well to have a low resistance. Accordingly, the width of those lines is generally made greater. A MOS transistor for short-circuiting those lines is required to withstand a high voltage. Therefore, a transistor of a relatively large size is used. A large number of interconnections, including address lines and various signal lines, enter control circuit 10 and then are distributed from control circuit 10 to sense amplifier 3 and row decoder 4. Therefore, control circuit 10 is overcrowded by a great many interconnections and therefore it is difficult to draw the source line and the interconnection of the cell well into control circuit 10 and provide a transistor for short-circuiting the lines in control circuit 10. In such a case, another problem arises: the layout of control circuit 10 is pressured to increase the area of the NAND flash memory.

In contrast, with the configuration of the first embodiment, short circuit 8 (MOS transistor 15) is arranged in a region where well driver 7 (MOS transistor 14) is provided. More specifically, short circuit 8 is arranged between sense amplifier 3-1 and memory cell array 2. By arranging short circuit 8 between sense amplifier 3-1 and memory cell array 2, MOS transistor 15 can be connected directly to a metal interconnection layer (e.g., a second-level metal interconnection layer) functioning as source line SL and well line WEL_L in memory cell array 2. That is, unnecessary outgoing lines are eliminated. Accordingly, source line SL and well line WEL_L can be made shorter in wiring to the extent that the interconnection resistance is negligible. As a result, the potential difference between source line SL and cell well 22 can be made smaller and therefore the operational stability of the NAND flash memory can be improved.

Furthermore, with the above configuration, there is no need to draw source line SL and well line WEL_L into control circuit 10 or provide high-voltage transistor 15 in control circuit 10. Accordingly, it is possible to simplify the layout of control circuit 10 and suppress an increase in the area of the NAND flash memory.

In addition, with the configuration of the first embodiment, source line driver 6 (MOS transistor 12) is arranged in a region near input/output pad group 9 and MOS transistors 14, 15 are arranged in a region away from input/output pad group 9. This arrangement enables the resistance of power line VSS_L to be kept low. A large cell current flows from bit line BL to source line SL. Therefore, the potential of power line VSS_L connected to source line SL by MOS transistor 12 is liable to rise. However, arranging MOS transistor 12 near input/output pad group 9 enables power line VSS_L to be grounded securely, improving the operating performance to source line driver 6.

On the other hand, a cell current does not flow directly into cell well 22. Therefore, even if MOS transistor 14 is arranged away from input/output pad group 9, there is no problem. Arranging MOS transistor 14 this way produces the following effect. As described above, the level of the grounding capability of well driver 7 need not be as high as that of source line driver 6. Accordingly, the number of MOS transistors 14 may be smaller than that of MOS transistors 12. In a region obtained by decreasing the number of MOS transistors 14, MOS transistors 15 can be arranged. Accordingly, MOS transistors 12, 14, 15 can be arranged efficiently, enabling the area of the NAND flash memory to be reduced.

[Second Embodiment]

Next, a semiconductor memory device according to a second embodiment will be explained. The second embodiment is such that the gate width of MOS transistor 12 in source line driver 6 in the first embodiment is made variable. Hereinafter, only what differs from the first embodiment will be explained.

<Source Line Driver 6>

Figure 16:
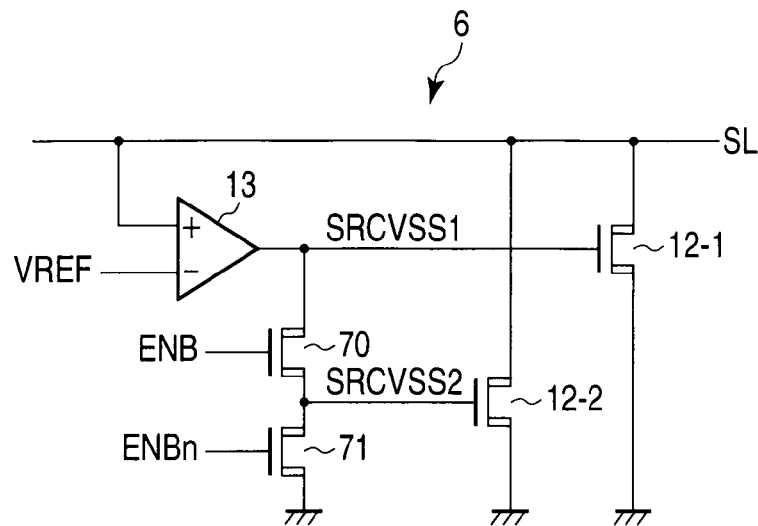
FIG. 16 is a circuit diagram of a source line driver according to a second embodiment.

FIG. 16 is a circuit diagram of source line driver 6 according to the second embodiment. As shown in FIG. 16, source line driver 6 is such that MOS transistor 12 includes two MOS transistors 12-1, 12-2 and MOS transistors 70, 71 are newly added.

Operational amplifier 13 compares the potential VSL of source line SL with a reference voltage VREF and outputs the comparison result as a signal SRCVSS1. More specifically, when VSL has exceeded VREF, operational amplifier 13 makes signal SRCVSS1 high.

MOS transistor 12-1, which is a high-withstand-voltage n-channel MOS transistor, has its drain connected to source line SL and its source grounded. Signal SRCVSS1 is input to the gate of MOS transistor 12-1. MOS transistor 12-2, which is also a high-withstand-voltage n-channel MOS transistor, has its drain connected to source line SL and its source grounded. Signal SRCVSS2 is input to the gate of MOS transistor 12-2. MOS transistors 12-1, 12-2 are, for example, of the same size. That is, they have the same gate width and the same current driving force.

MOS transistor 70, which is a high-withstand-voltage n-channel MOS transistor, has its drain connected to the output node (output node of signal SRCVSS1) of operational amplifier 13. Signal ENB is input to the gate of MOS transistor 70. MOS transistor 71, which is also a high-withstand-voltage n-channel MOS transistor, has its drain connected to the source of MOS transistor 70 and its source grounded. Signal ENBn is input to the gate of MOS transistor 71. The potential at a connection node between the source of MOS transistor 70 and the drain of MOS transistor 71 is output as signal SRCVSS2. Signals ENB, ENBn are supplied by, for example, control circuit 10.

Figure 17:
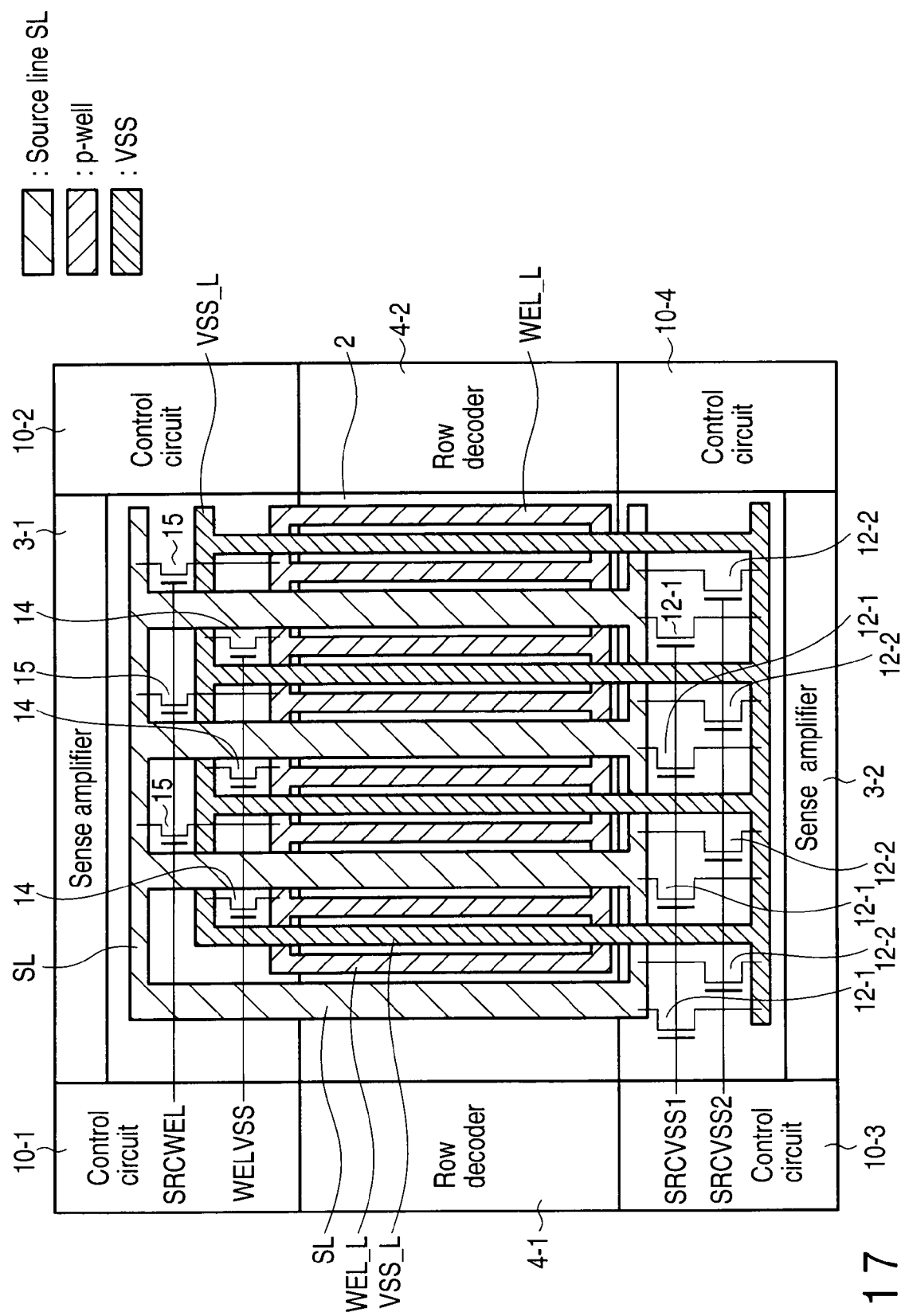
FIG. 17 is a block diagram of a flash memory according to the second embodiment.

FIG. 17 is a block diagram showing a planar arrangement of memory cell array 2, sense amplifier 3, row decoder 4, source line driver 6, well driver 7, and short circuit 8 in the NAND flash memory of the second embodiment.

As shown in FIG. 17, MOS transistors 12-1, 12-2 of source line driver 6 are arranged between memory cell array 2 and sense amplifier 3-2. The gate of each of the MOS transistors is drawn to control circuit 10-3. Signals SRCVSS1, SRCVSS2 are applied to the gate electrodes. Although not shown in FIG. 17, input/output pad group 9 is arranged closer to MOS transistors 12-1, 12-2 than MOS transistors 14, 15.

<Control of Source Line Driver 6 by Control Circuit 10>

Figure 18:
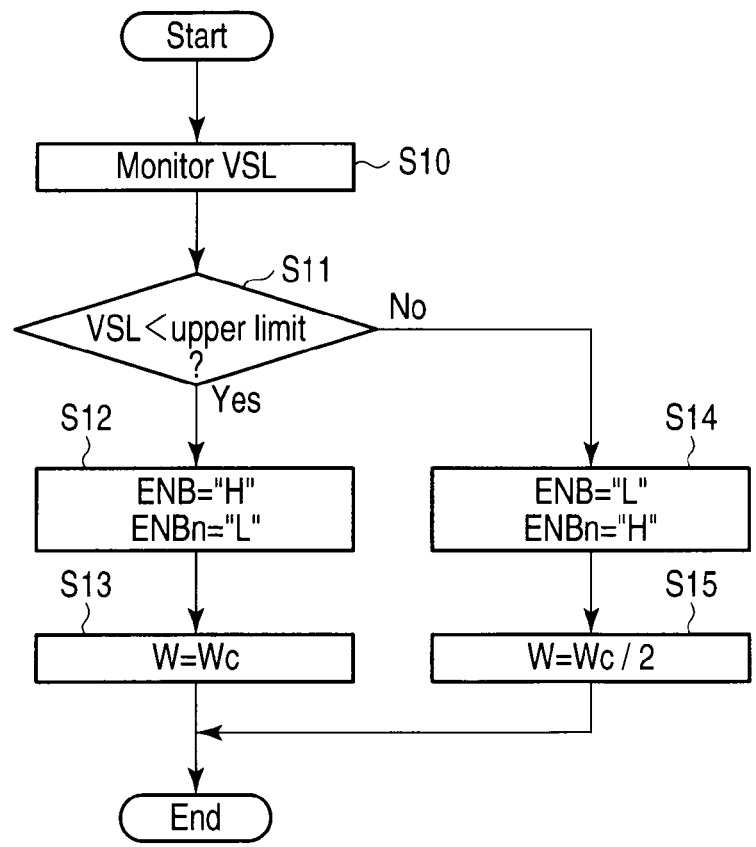
FIG. 18 is a flowchart to explain a read operation according to the second embodiment.

Next, control of source line driver 6 performed by control circuit 10 in reading data will be explained with reference to FIG. 18. FIG. 18 is a flowchart to explain a part of the read operation of control circuit 10.

As shown in FIG. 18, control circuit 10 monitors potential VSL of source line SL (step S10). Alternatively, a value to be set as potential VSL by control circuit 10 is substituted for the monitored potential. Control circuit 10 checks whether the potential VSL is lower than a predetermined upper limit. If VSL is lower than the upper limit (YES in step S11), control circuit 10 makes signal ENB high and signal ENBn low (step S12). As a result, the levels of signal SRCVSS2 and signal SRCVSS1 become the same. Consequently, source line SL is driven by both of MOS transistors 12-1 and 12-2. That is, the gate width W of MOS transistor 12 of source line driver 6 is equal to the sum We of the gate widths of two MOS transistors 12-1, 12-2 (step S13).

If VSL is not lower than the upper limit (NO in step S11), control circuit 10 makes signal ENB low and signal ENBn high (step S14). As a result, signal SRCVSS2 is fixed to the ground level (low level or level "L"), turning off MOS transistor 12-2. Accordingly, source line SL is driven only by MOS transistor 12-1. That is, the gate width W of MOS transistor 12 of source line driver 6 is We/2 (step S15).

<Effect>

The configuration of the second embodiment not only produces the effect explained in the first embodiment, but also further improves the operation stability of the NAND flash memory. The newly produced effect will be explained in detail.

As explained in the first embodiment, one method of programming memory cells with negative threshold values is to virtually realize negative VGS by setting the source line at a certain positive level in order to perform a verify operation. While in the first embodiment, the level of source line SL has been kept at VREF during a read operation, the level sometimes changes, depending on the operation or the target threshold level. The cell current changes each time the data pattern of the memory cells change. Although it is difficult to predict the data pattern of the cells, it is possible to know the target level of the cell source in a read operation or a verify operation.

To fix the level of source line SL to a positive voltage, it is necessary to cause current to flow constantly to source line SL and at the same time, discharge source line SL. The discharging is performed by MOS transistor 12 of source line driver 6. At this time, the cell current may change the gate voltage of MOS transistor 12 greatly. Therefore, it is necessary to cause MOS transistor 12 to operate stably in a wider voltage range. For example, when the level of source line is low and cell current is large, VGS of MOS transistor 12 is very high and therefore more current has to be discharged. On the other hand, when the level of source line SL is low and cell current is small, VGS of MOS transistor 12 becomes very low and sometimes drops to a gate level close to the threshold value of MOS transistor 12. However, MOS transistor 12 is liable to operate unstably near the threshold value.

Figure 19:
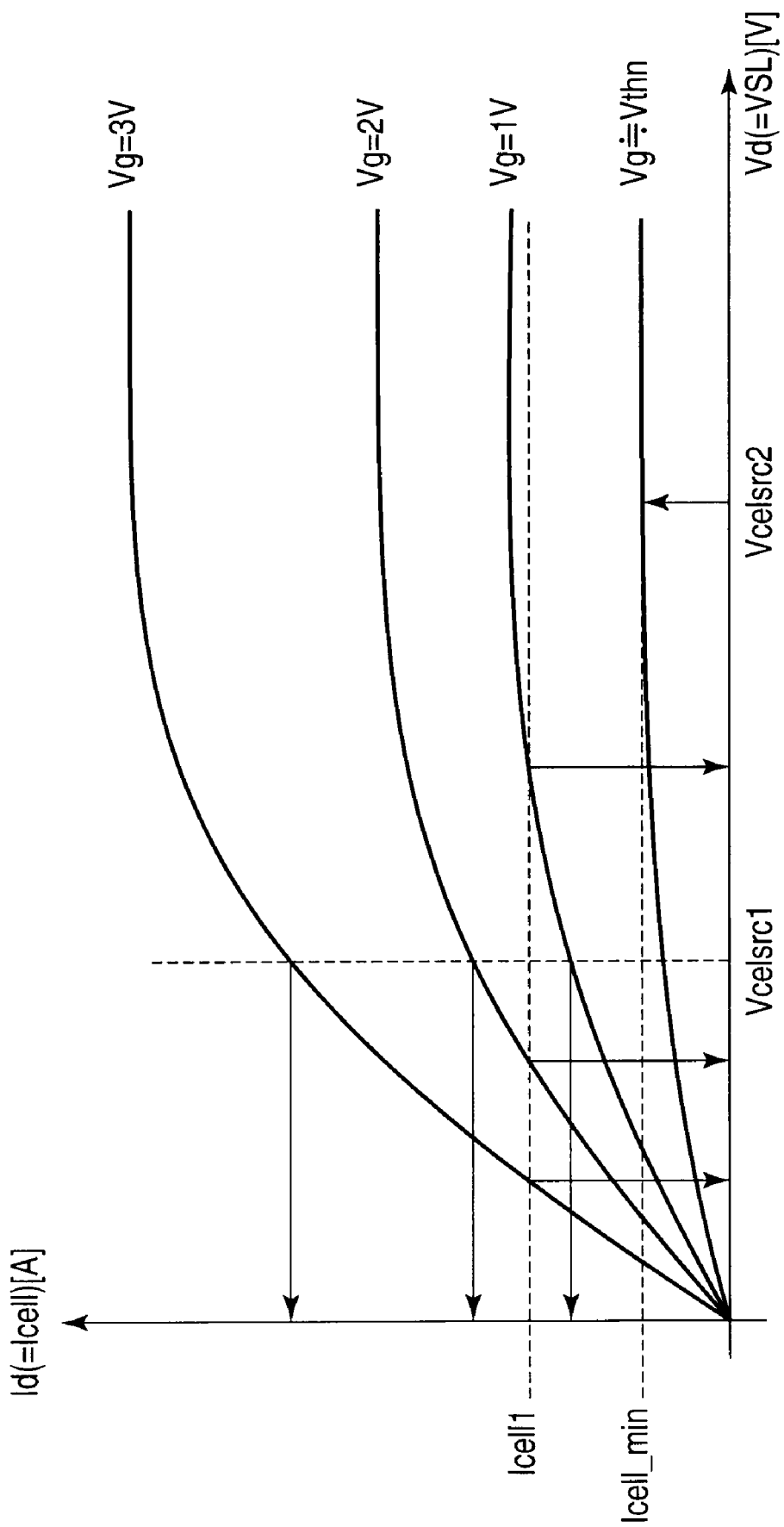
FIG. 19 is a graph showing the operating characteristic of a MOS transistor.

This problem will be explained with reference to FIG. 19. FIG. 19 is a graph showing a characteristic of drain current Id (=cell current Icell) with respect to drain voltage Vd (=voltage VSL of source line) of a MOS transistor for discharging the source line.

As shown in FIG. 19, in the case of a certain cell current Icell1, the higher the gage voltage Vg of the MOS transistor is, the lower the cell source level (source line voltage) can be made. In the case of a certain cell source level Vcelsrc1, the higher the gate voltage Vg of the MOS transistor is, the more the cell current can be discharged. Although it is possible to deal with a certain range of cell source level by varying the gate voltage, the condition for the gate voltage depends on the power supply voltage of the operational amplifier that controls the gate voltage. When an attempt is made to realize a high cell source level Vcelsrc2 with an extremely small cell current (Icell_min), the gate voltage gets close to the threshold value Vthn, making the operation of the MOS transistor unstable.

In contrast, with the configuration of the second embodiment, control circuit 10 changes the gate width of MOS transistor 12 according to the source level, thereby controlling the driving force of source line driver 6. More specifically, when the cell source level is high, the gate width W of MOS transistor 12 that discharges source line SL may be narrower. Therefore, only MOS transistor 12-1 is used. When the cell source level is low, a higher level of discharging capability is needed. Therefore, not only MOS transistor 12-1 but also MOS transistor 12-2 is used at the same time.

Figure 20:
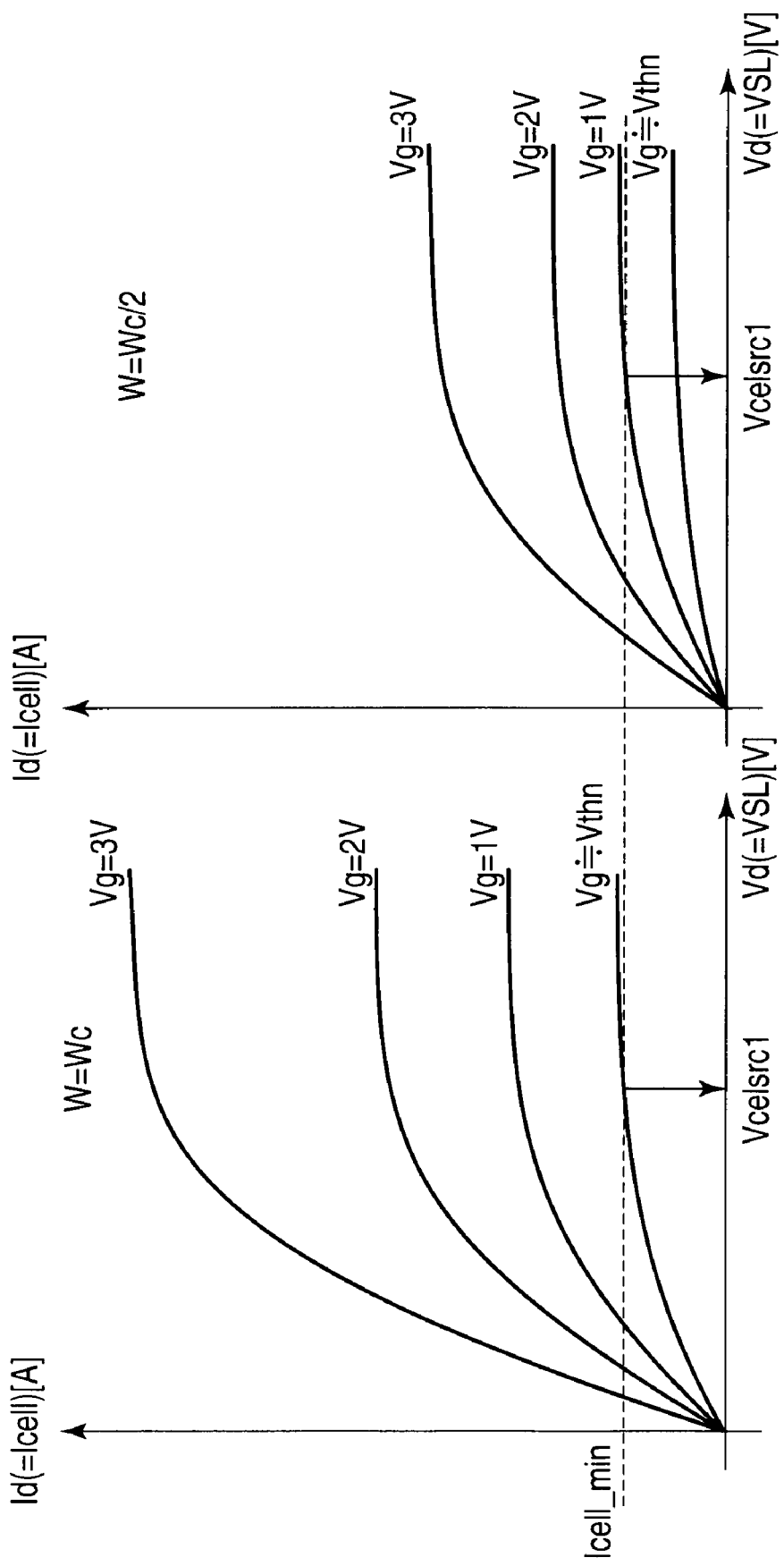
FIG. 20 is a graph showing the characteristics of a source line driver according to the second embodiment.

This will be explained with reference to FIG. 20. FIG. 20 is a graph showing a characteristic of drain current Id (=cell current Icell) with respect to drain voltage Vd (=voltage VSL of source line) of MOS transistor 12 according to the second embodiment. The graph on the left side shows a case where both MOS transistors 12-1 and 12-2 are used (W=Wc). The graph on the right side shows a case where only MOS transistor 12-1 is used (W=Wc/2).

As shown in FIG. 20, in a case where an attempt is made to realize a certain source level Vcelsrc1 with an extremely small cell current Icell_min, when W=Wc, the gate voltage Vg of MOS transistor 12 is at a level very close to the threshold value Vthn, making MOS transistor 12 operate unstably. Accordingly, in the case of such a cell source level (NO in step S11 of FIG. 18), control circuit 10 makes signal ENB low and signal ENBn high, thereby preventing MOS transistor 12-2 from being used. As a result, the gate width W of MOS transistor 12 becomes Wc/2. With the gate width W being halved, MOS transistor 12 presents the characteristic on the right side of FIG. 20. That is, it is possible to raise the gate voltage for realizing the same cell source level Vcelsrc. Consequently, the operation stability of MOS transistor 12 can be improved.

As described above, changing the gate width of MOS transistor 12 (the number of MOS transistors 12-1, 12-2 to be turned on) according to the desired cell source level makes it possible to deal with a wider range of cell source levels and cell currents.

In the flowchart of FIG. 18, the gate width of MOS transistor 12 has been controlled according to the cell source level. As described above, however, the cell source level is not the only factor that determines the gate width of MOS transistor 12; there is also the cell current. Accordingly, the gate width of MOS transistor 12 may be controlled by taking not only the cell source level but also the cell current into account. Alternatively, the gate width of MOS transistor 12 may be controlled according to the cell current, not the cell source level. In this case, when the cell current has dropped below the lower limit, the gate width W of MOS transistor 12 is made Wc/2.

As described above, a semiconductor memory device according to the first and second embodiments includes a memory cell array 2 in which a plurality of memory cells MT are arranged, a word line WL connected to the gates of the memory cells MT, a bit line BL electrically connected to the drains of the memory cells MT, a source line SL electrically connected to the sources of the memory cells MT, a row decoder 4 configured to select a word line WL, a sense amplifier 3 configured to sense and amplify data read onto the bit line BL in a read operation, a well region 22 in which memory cells MT are formed, and first MOS transistor 15 capable of connecting the well region 22 with the source lines SL. The first MOS transistor 15 is arranged between the sense amplifier 3 and the memory cell array 2.

In the semiconductor memory device of the second embodiment, the source line driver 6 includes a plurality of MOS transistors 12-1, 12-2 connected in parallel. The number of MOS transistors 12-1, 12-2 turned on can be varied according to the current in and/or voltage on source line SL.

With the above configuration, the operational stability of the semiconductor memory device can be improved.

The arrangement of MOS transistors 12, 14, 15 is not limited to that of FIG. 3. They may be arranged in other ways, provided that MOS transistor 15 is provided between memory cell array 2 and sense amplifier 3 or row decoder 4. For example, as shown in a plan view of FIG. 21, MOS transistor 15 may be provided between memory cell array 2 and row decoder 4-1 and between memory cell array 2 and row decoder 4-2.

Figure 22:
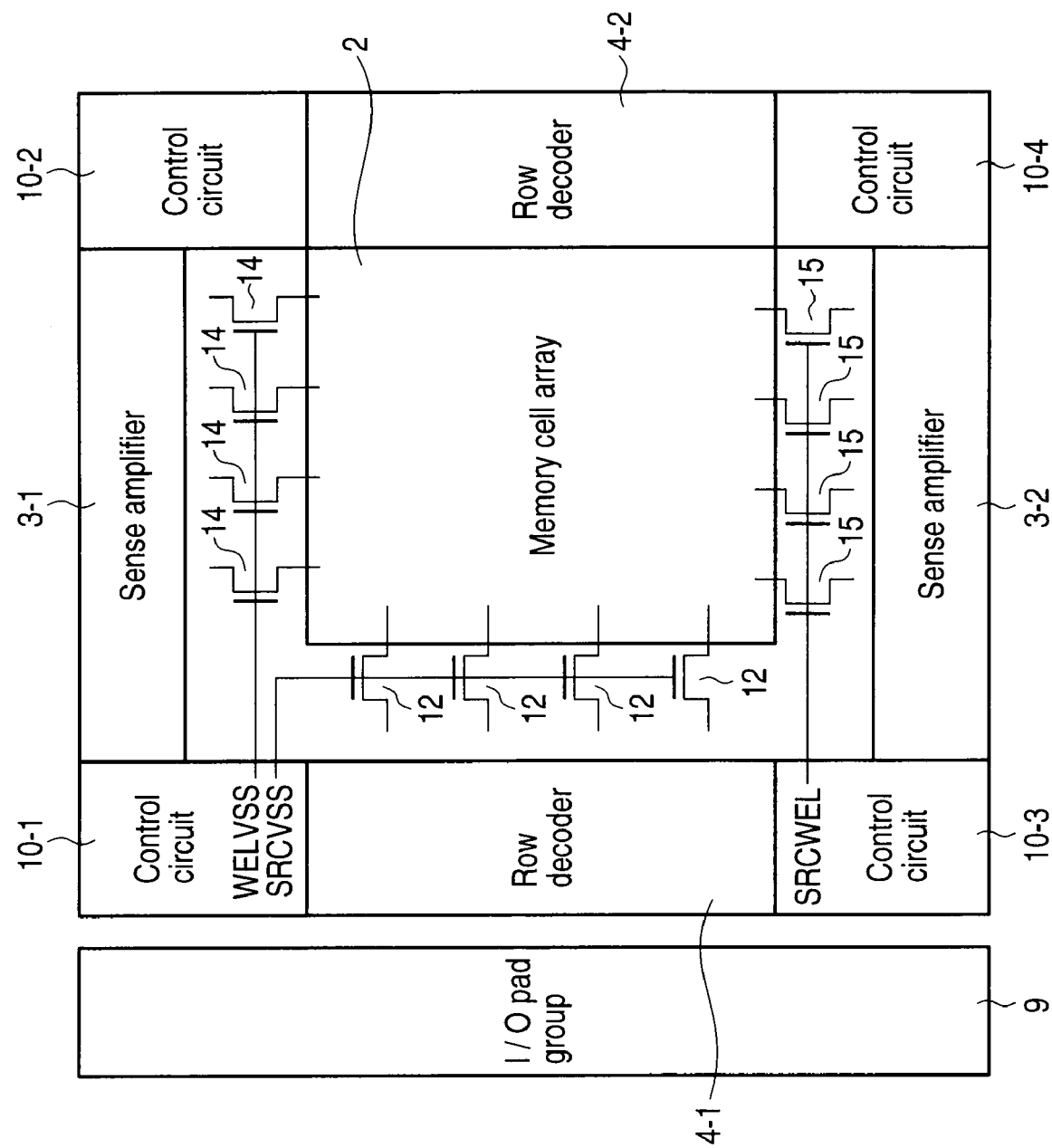

Furthermore, as shown in a plan view of FIG. 22, when input/output pad group 9 is arranged close to row decoder 4-1, that is, when row decoder 4-1 is sandwiched between input/output pad group 9 and memory cell array 2, MOS transistor 12 may be provided between memory cell array 2 and row-decoder 4-1. In this case, MOS transistor 14 may be provided between memory cell array 2 and sense amplifier 3-1 and MOS transistor 15 be provided between memory cell array 2 and sense amplifier 3-2. Of course, either MOS transistor 14 or 15 may be arranged between memory cell array 2 and row decoder 4-2.

MOS transistor 12 is not necessarily provided close to input/output pad group 9. That is, when MOS transistor 12 is not required to have such a high level of grounding capability, it may be arranged freely, taking no account of the positional relationship with input/output pad group 9. The number of MOS transistors 14 is not necessarily smaller than that of MOS transistors 12 and may be equal to or larger than the latter. MOS transistors 15 may be provided in the same region where MOS transistors 12 are provided.

In the embodiments, input/output pad group 9 has been provided adjacent to only one side of memory cell array 2. However, a plurality of input/output pad groups 9 may be provided. For example, in FIG. 3, another input/output pad group 9 may be provided so as to face the existing input/output pad group 9 with memory cell array 2 between them.

In the second embodiment, MOS transistor 12 includes two MOS transistors 12-1, 12-2, although it may include three or more MOS transistors. In addition, the size (gate width) of MOS transistor 12-1 may differ from that of MOS transistor 12-2. The second embodiment can be implemented independently of the first embodiment. That is, in the second embodiment, MOS transistor 15 may be provided in control circuit 10. In this case, the effect explained in the second embodiment can be obtained.

In FIG. 2, there has been only one item of data whose read level is negative (level "A") except for in the erase state (level "Er"), although there may be two items of data. Although in a read operation, positive voltage VREF has been applied to source line SL and cell well 22 to read any level, VREF may not be applied (or VREF=0 V may be applied). Alternatively, VREF may be applied to read only a negative threshold level and may not be applied to read a positive threshold level.

Figure 23:
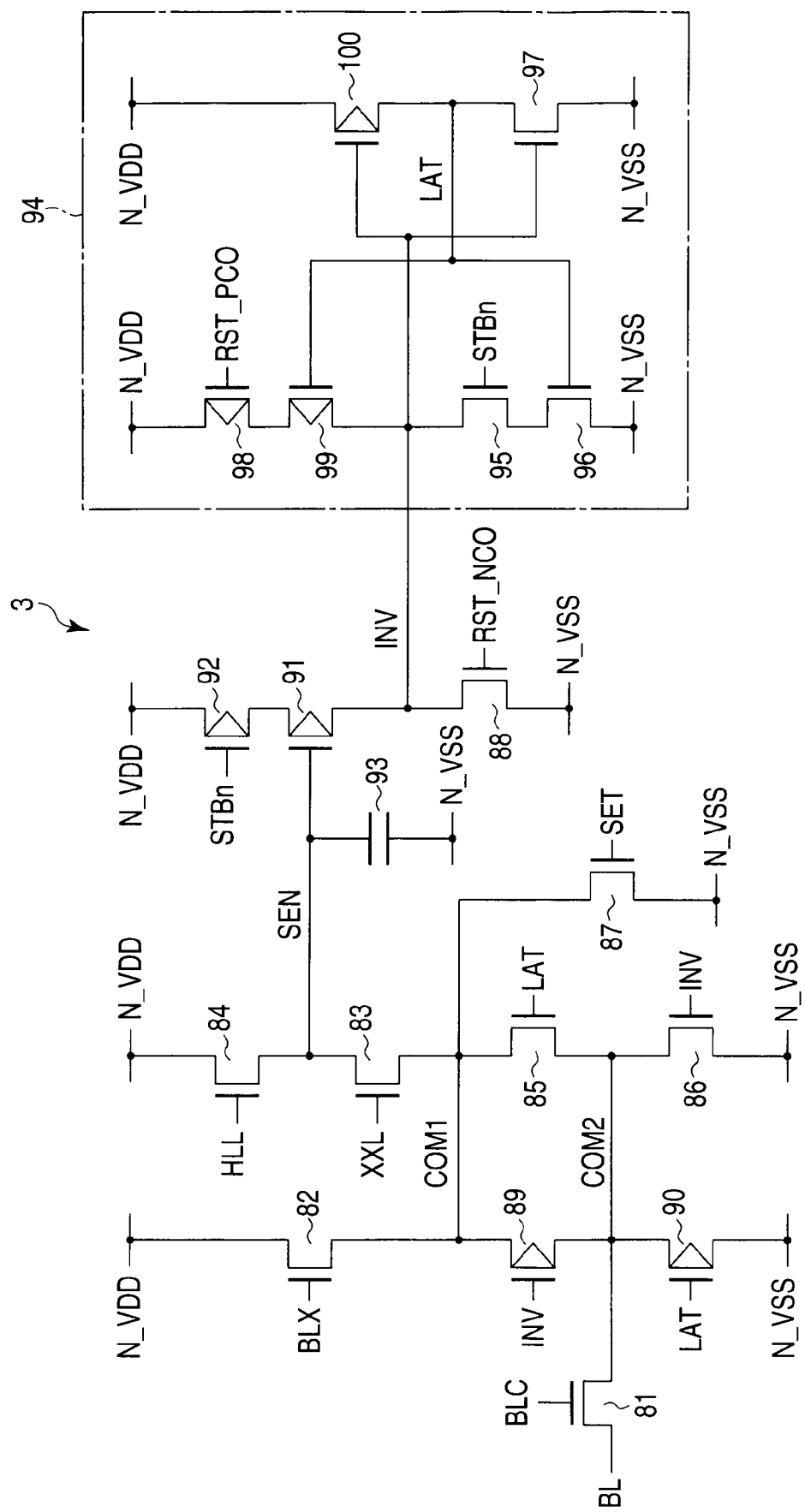
FIG. 23 is a circuit diagram of a sense amplifier according to the first and second embodiments.

A configuration of sense amplifier 3 will be explained with reference to FIG. 23. FIG. 23 is a circuit diagram of sense amplifier 3. The configuration of FIG. 23 is provided for, for example, each bit line BL. As shown in FIG. 23, sense amplifier 3 includes n-channel MOS transistors 81 to 88, p-channel MOS transistors 89 to 92, a capacitor element 93, and a latch circuit 94.

One end of the current path of MOS transistor 81 is connected to any one of the bit lines BL and the other end is connected to node COM2. Signal BLC is applied to the gate of MOS transistor 81. One end of the current path of MOS transistor 90 is connected to node CCM2 and the other end is connected to node N_VSS to which voltage VSS (e.g., 0 V) is applied. The gate of MOS transistor 90 is connected to node LAT. One end of the current path of MOS transistor 86 is connected to node COM2 and the other end is connected to node N_VSS. The gate of MOS transistor 86 is connected to node INV. One end of the current path of MOS transistor 89 is connected to node COM2 and the other end is connected to node COM1. The gate of MOS transistor 89 is connected to node INV. One end of the current path of MOS transistor 85 is connected to node COM2 and the other end is connected to node COM1. The gate of MOS transistor 85 is connected to node LAT. One end of the current path of MOS transistor 87 is connected to node COM1 and the other end is connected to node N_VSS. Signal SET is input to the gate of MOS transistor 87. One end of the current path of MOS transistor 82 is connected to node N_VDD to which voltage VDD (e.g., 1.5 V) is applied and the other end is connected to node COM1. Signal BLX is input to the gate of MOS transistor 82. One end of the current path of MOS transistor 83 is connected to node SEN and the other end is connected to node COM1. Signal XXL is input to the gate of MOS transistor 83. One end of the current path of MOS transistor 84 is connected to node N_VDD and the other end is connected to node SEN. Signal HLL is input to the gate of MOS transistor 84. One electrode of capacitor element 93 is connected to node SEN and the other electrode is connected to node N_VSS. One end of the current path of MOS transistor 88 is connected to node INV and the other end is connected to node N_VSS. Signal RST_NCO is input to the gate of MOS transistor 88. One end of the current path of MOS transistor 91 is connected to node INV. The gate of MOS transistor 91 is connected to node SEN. One end of the current path of MOS transistor 92 is connected to node N_VDD and the other end is connected to the other end of the current path of MOS transistor 91. Signal STBn is input to the gate of MOS transistor 92.

Latch circuit 94 latches data at node INV, a connection node between MOS transistors 88, 91. That is, latch circuit 94 includes n-channel MOS transistors 95 to 97 and p-channel MOS transistors 98 to 100.

One end of the current path of MOS transistor 95 is connected to node INV. Signal STBn is input to the gate of MOS transistor 95. One end of the current path of MOS transistor 96 is connected to node N_VSS and the other end is connected to the other end of the current path of MOS transistor 95. The gate of MOS transistor 96 is connected to node LAT. One end of the current path of MOS transistor 99 is connected to node INV and the gate of MOS transistor 99 is connected to node LAT. One end of the current path of MOS transistor 98 is connected to node N_VDD and the other end is connected to the other end of the current path of MOS transistor 99. Signal RST_PCO is input to the gate of MOS transistor 98. One end of the current path of MOS transistor 97 is connected to node N_VSS and the other end is connected to node LAT. The gate of MOS transistor 97 is connected to node INV. One end of the current path of MOS transistor 100 is connected to node N_VDD and the other end is connected to node LAT. The gate of MOS transistor 100 is connected to node INV.

When 0 V is applied to source line SL and cell well 22 in reading data, VSS and VDD are applied to nodes N_VSS and N_VDD, respectively. When VREF (>0 V) is applied to source line SL and cell well 22, (VSS+VREF) and (VDD+VREF) are applied to nodes N_VSS and N_VDD, respectively.

<Read Operation of Sense Amplifier>

Next, the read operation of sense amplifier 3 will be explained briefly with reference to FIG. 23. Hereinafter, when memory cell transistor MT goes on, this is referred to as "1" reading. When memory cell transistor MT goes off, this is referred to as "0" reading. When 0 V is applied to source line SL and cell well 22 during a read operation, signals BLX and XXL are set at (Vt+0.9 V) and (Vt+1.2 V), respectively. In addition, signal BLC is set at (VTN+0.7 V). Vt is the threshold voltage of MOS transistors 82, 83. VTN is the threshold voltage of MOS transistor 81. When VREF (>0 V) is applied to source line SL and cell well 22, VREF is added to the above values and the resulting voltages are applied. The same holds true for other voltages in the explanation below.

Signals SET, RST_NCO can be made high ("H") in a reset operation, thereby making nodes COM1, INV low (0 V) and node LAT high (VDD). In a normal operation, signals SET, RST_NCO are made high and MOS transistors 88, 89 are made off. In addition, signal RST_PCO can be made high in a reset operation and low in a normal operation.

(CASE I)

CASE I, where "1" reading is performed, will be explained.

First, a bit line BL is precharged. Suppose precharge level VPRE is at 0.7 V.

Precharging is performed by MOS transistor 82. That is, signal BLX is supplied, turning on MOS transistor 82. This brings NAND string 11 into a conducting state, allowing current to flow through the bit line BL via the current paths of MOS transistors 81, 85, 89 and nodes COM1, COM2. As a result, the potential of the bit line BL is at about 0.7 V (or 0.7 V+VREF). That is, the potential of the bit line BL is fixed to 0.7 V, while a current is allowed to flow from the bit line BL to source line SL. At this time, MOS transistors 86, 90 are off.

Signal HLL is supplied, which charges capacitor element 93, with the result that the potential at node SEN reaches about 2.5 V.

Next, node SEN is discharged. That is, signal HLL is made low, which turns off MOS transistor 84. Then, the current flowing from node SEN to bit line BL discharges node SEN, with the result that the potential at node SEN drops to about 0.9 V (low level).

Node SEN is further discharged. At this time, when the potential at node COM1 drops to 0.9 V or lower, MOS transistor 82 starts to supply current. As a result, the potential at node COM1 is kept at 0.9 V.

Next, data is sensed. That is, signal STBn is made low, thereby turning on MOS transistor 92. Since the potential at node SEN is at 0.9 V, MOS transistor 91 goes on. Accordingly, the potential at node INV goes high (VDD), which is held in latch circuit 94. That is, node INV goes high, turning on MOS transistor 97, which makes node LAT high. As a result, MOS transistors 85, 89 go off and MOS transistors 86, 90 go on. Consequently, the bit line BL is connected to node N_VSS via the current paths of MOS transistors 86, 90, thereby fixing the potential at node N_VSS to VSS.

(CASE II)

Next, CASE II where "0" reading is performed will be explained.

In this case, no current flows through the bit line BL and its potential is constantly at 0.7 V. The potential at node SEN is kept at about 2.5 V (high level). Accordingly, MOS transistor 91 goes off and node INV is kept at the low level. Latch circuit 94 latches the low level at node INV.

As described above, the sense amplifier according to the embodiments senses current flowing through the bit line BL, thereby performing a data read operation on all the bit lines simultaneously. The sense amplifier may sense voltage instead of current.

While in the above embodiments a NAND flash memory has been used, the embodiments may be applied to, for example, a NOR flash memory, a semiconductor memory where the source of a cell and the cell well have to be short-circuited, and semiconductor memory in general where the driving capability of source lines becomes a problem.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   memory cells capable of holding data;
   a memory cell array in which the memory cells are arranged;
   a word line connected to gates of the memory cells;
   a bit line electrically connected to drains of the memory cells;
   a source line electrically connected to sources of the memory cells;
   a row decoder which selects the word line;
   a sense amplifier which senses and amplifies data read onto the bit line in a read operation;
   a first MOS transistor which is capable of connecting a well region where the memory cells are formed with the source line and which is arranged between the row decoder or the sense amplifier and the memory cell array;

a second MOS transistor which is capable of supplying a voltage to the well region; and third MOS transistors which are capable of supplying a voltage to the source line, wherein the sense amplifier includes a first region and a second region which faces the first region with the memory cell array between the first and second regions, the first MOS transistor is arranged between the second region and the memory cell array, the second MOS transistor is arranged between the first region and the memory cell array, and the third MOS transistors are arranged between the row decoder and the memory cell array.

2. The device according to claim 1, wherein a threshold value of the memory cells has at least one of first to third levels according to data the memory cells hold, and the first and second levels are negative.

3. The device according to claim 2, wherein a voltage not lower than zero is applied to the word line and a positive voltage is applied to the source line and the well region when data at least at the first level is read.

4. The device according to claim 1, further comprising a source line driver which discharges the source line, wherein the driving force of the source line driver is variable.

5. The device according to claim 4, wherein the source line driver includes a plurality of MOS transistors connected in parallel, and the driving force is controlled by the number of the MOS transistors turned on.

* * * * *